United States Patent
Hayashi

(10) Patent No.: US 8,507,963 B2
(45) Date of Patent: Aug. 13, 2013

(54) PHOTOELECTRIC CONVERSION DEVICE AND ITS MANUFACTURING METHOD

(75) Inventor: Masami Hayashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 153 days.

(21) Appl. No.: 12/939,568

(22) Filed: Nov. 4, 2010

(65) Prior Publication Data
US 2011/0127593 A1    Jun. 2, 2011

(30) Foreign Application Priority Data
Nov. 30, 2009 (JP) .................... 2009-271958

(51) Int. Cl.
*H01L 31/062* (2012.01)

(52) U.S. Cl.
USPC ......... 257/292; 257/E31.121; 257/53; 438/65

(58) Field of Classification Search
USPC ............... 257/292, E31.121; 438/65
See application file for complete search history.

(56) References Cited

U.S. PATENT DOCUMENTS

| 4,633,287 | A * | 12/1986 | Yamazaki ............ 257/9 |
| 6,753,915 | B1 | 6/2004 | Mochizuki |
| 2005/0263709 | A1 * | 12/2005 | Watanabe et al. ........ 250/370.11 |
| 2009/0026509 | A1 * | 1/2009 | Hayashi et al. ............. 257/292 |

FOREIGN PATENT DOCUMENTS

JP    2000-101920    4/2000

* cited by examiner

*Primary Examiner* — Wael Fahmy
*Assistant Examiner* — Sarah Salerno
(74) *Attorney, Agent, or Firm* — Oblon, Spivak, McClelland, Maier & Neustadt, L.L.P.

(57) ABSTRACT

A photoelectric conversion device in accordance with an aspect of the present invention includes a thin-film transistor formed on a substrate, and a photo diode electrically connected to the thin-film transistor, wherein the photo diode includes a lower electrode connected to a drain electrode of the thin-film transistor, a photoelectric conversion layer formed on the lower electrode, an upper electrode formed from a transparent conductive film on the photoelectric conversion layer, the upper electrode being formed so as to be contained within an upper surface of the photoelectric conversion layer as viewed from a top, and a protective film (compound layer or the like) formed so as to protect a part of an upper surface of the photoelectric conversion layer located outside the upper electrode.

10 Claims, 17 Drawing Sheets

PHOTOELECTRIC CONVERSION DEVICE AND ITS MANUFACTURING METHOD

INCORPORATION BY REFERENCE

This application is based upon and claims the benefit of priority from Japanese patent application No. 2009-271958, filed on Nov. 30, 2009, the disclosure of which is incorporated herein in its entirety by reference.

BACKGROUND OF THE INVENTION

1. Field of the Invention

The present invention relates to a photoelectric conversion device and its manufacturing method, in particular, to a photoelectric conversion device using a substrate on which photoreceptor pixels each having a photo diode and a thin-film transistor are arranged in array, and its manufacturing method.

2. Description of Related Art

Photo-sensors, which are photoelectric conversion devices, are flat panels equipped with a TFT array substrate on which photo diodes that convert visible rays into electricity and thin-film transistors (TFTs) are arranged. Such photo-sensors have been applied to and widely used in contact image sensors, radiographic display devices, and the likes. In particular, flat-panel radiographic display devices (hereinafter called "FPDs (Flat Panel Detectors)"), which are constructed by disposing a scintillator that converts X-rays into visible rays on an TFT array substrate, are considered to be promising devices that can be applied to the medical industry and the like.

In the field of X-ray diagnostic imaging, either or both of the precise images (still images) and the real-time image observation (moving images) have been used according to their purposes. For the shooting of still images, X-ray films are still predominantly used. Meanwhile, for the shooting of moving images, image-pickup tubes (image intensifier) in which a photomultiplier tube is combined with a CCD are used. Although X-ray films have a high spatial resolution, their sensitivity is low. Therefore, they can be used only for the shooting of still images. Further, the X-ray films have a drawback that they require a development process after the shooting, thus lacking in immediacy. Meanwhile, although image-pickup tubes have high sensitivity and thus be able to be used for the shooting of moving images, their spatial resolution is low. Further, since the image-pickup tubes are vacuum devices, they have a drawback that the upsizing of the devices is limited.

There are two modes of the FPDs, i.e., an indirect conversion mode in which X-rays are converted into light by a scintillator such as CsI and then the light is converted into an electrical charge by a photo diode, and a direct conversion mode in which X-rays are converted directly into an electrical charge by a X-ray sensing element typified by Se. The indirect conversion mode has higher quantum efficiency and a better signal/noise ratio (S/N ratio) in comparison to the direct conversion mode. Therefore, in the indirect conversion mode, fluoroscopy and/or image-taking can be performed with fewer radiation doses. Configurations and manufacturing methods of array substrates for indirect conversion mode FPDs have been disclosed in the past (for example, Japanese Unexamined Patent Application Publication No. 2000-101920).

SUMMARY OF THE INVENTION

In the array substrate for the FPD, the formation of photo diodes is important because it affects the sensitivity, noise, and the like of the photo sensor. In general, the photo diodes have such a configuration that an upper electrode composed of a transparent conductive film is provided on an amorphous silicon layer, which is a photoelectric conversion layer formed on a lower electrode. However, there has been a problem that the pattern end portion of this amorphous silicon layer is damaged in the etching process of the amorphous silicon layer, and as a result, causing the increase in the leak current of the photo diode. Further, an electrical charge is trapped at the damaged pattern end portion of the amorphous silicon layer and hence the response speed of the charge transfer is lowered. As a result, there has been a problem that it causes the increase of afterimages.

The present invention has been made to solve the above-described problems, and an object thereof is to provide a photoelectric conversion device having high performance and its manufacturing method.

A photoelectric conversion device in accordance with an exemplary aspect of the present invention includes: a thin-film transistor formed on a substrate; and a photo diode electrically connected to the thin-film transistor, wherein the photo diode includes: a lower electrode connected to a drain electrode of the thin-film transistor; a photoelectric conversion layer formed on the lower electrode; an upper electrode formed from a transparent conductive film on the photoelectric conversion layer, the upper electrode being formed so as to be contained within an upper surface of the photoelectric conversion layer as viewed from a top; and a protective film formed so as to protect a part of an upper surface of the photoelectric conversion layer located outside the upper electrode.

Further, a method of manufacturing a photoelectric conversion device in accordance with another aspect of the present invention is a method of manufacturing a photoelectric conversion device including a thin-film transistor and a photo diode electrically connected to the thin-film transistor, the manufacturing method including: forming films of a lower electrode, a photoelectric conversion layer, and an upper electrode formed from a transparent conductive film in this order on a substrate, the lower electrode, the photoelectric conversion layer, and the upper electrode constituting the photo diode; patterning the formed upper electrode; forming a protective film that protects at least a part of a surface of the photoelectric conversion layer located outside the upper electrode; forming a resist pattern in a layer above the protective film, the resist pattern containing the upper electrode therewithin as viewed from a top; patterning the protective film and the photoelectric conversion layer by using the resist pattern as a mask; and removing the resist pattern.

The present invention can provide a photoelectric conversion device having high performance and its manufacturing method.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE EXEMPLARY EMBODIMENTS

Figure 1:
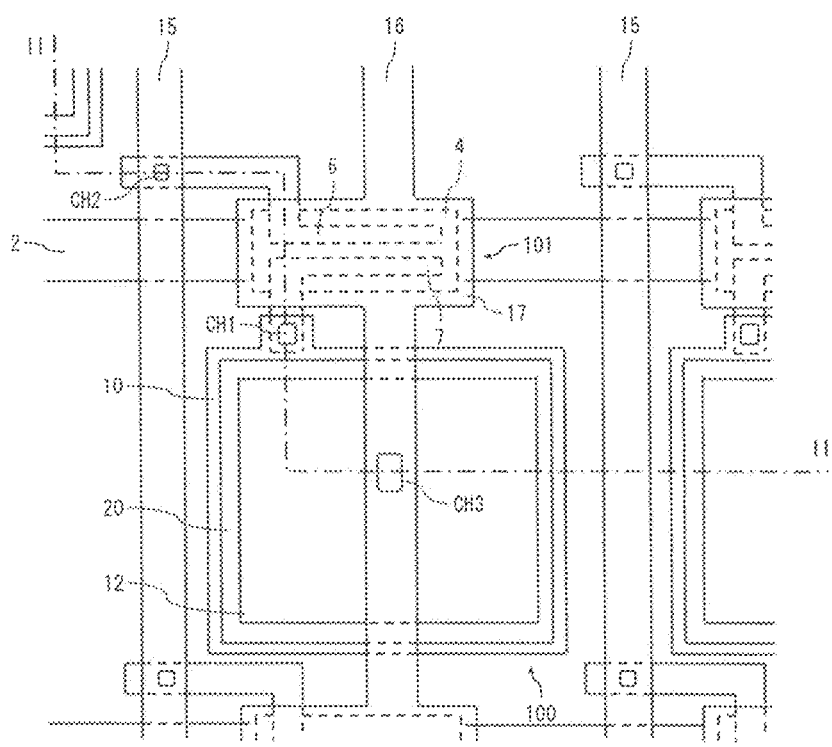
FIG. 1 is a plane view showing a configuration of an array substrate used in a photoelectric conversion device in accordance with a first exemplary embodiment of the present invention.
Figure 2:
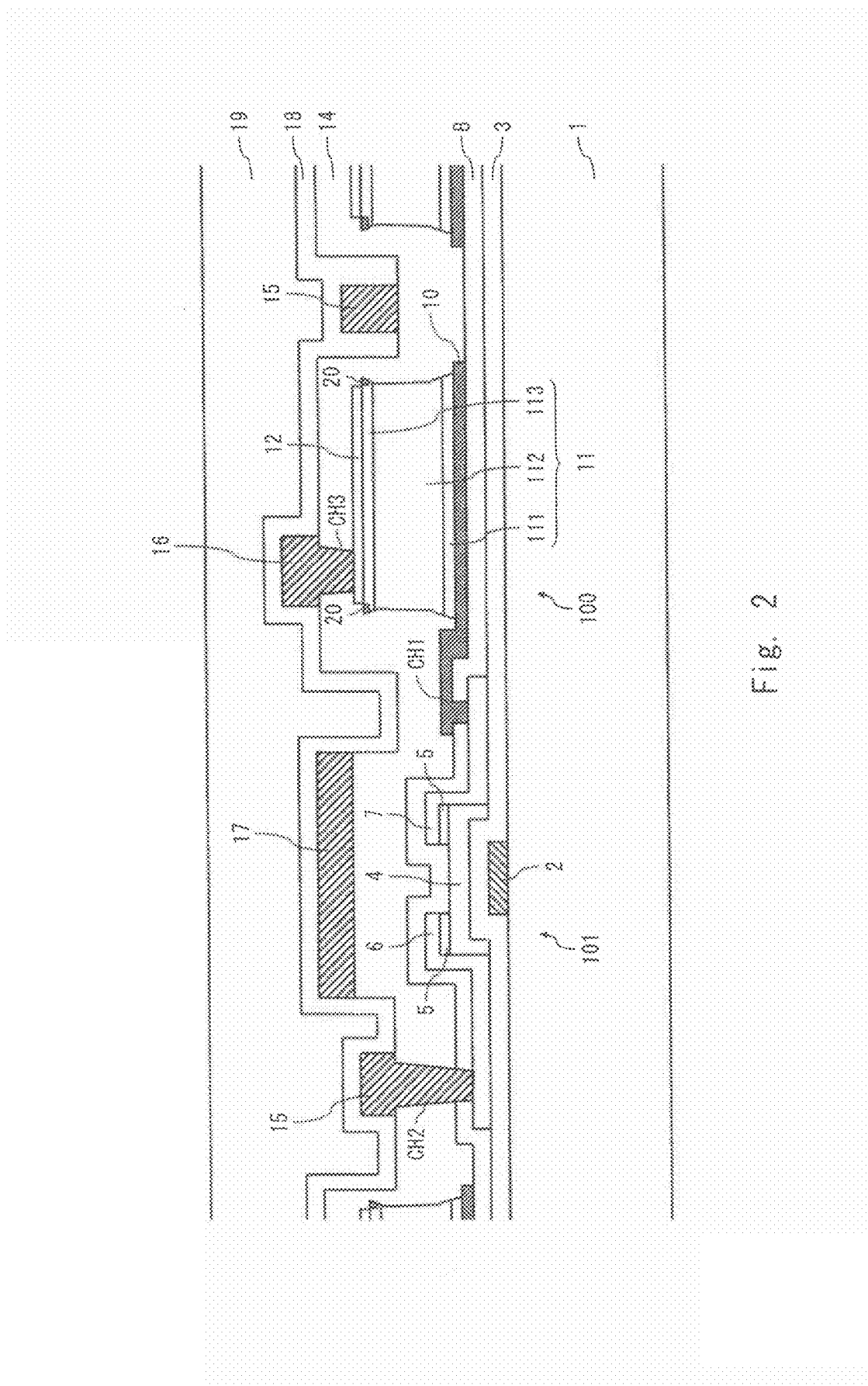
FIG. 2 is a cross section taken along the line II-II of FIG. 1.

Exemplary embodiments of the present invention are explained hereinafter with reference to the drawings. The following description and the drawings are partially omitted or simplified as appropriate for clarifying the explanation. Further, duplicated explanation is also omitted as appropriate for clarifying the explanation. Note that similar components are denoted by the same signs throughout the drawings and that explanations thereof are omitted as appropriate.
First Exemplary Embodiment A photo sensor (photoelectric conversion device) in accordance with a first exemplary embodiment of the present invention is explained with reference to FIGS. 1 and 2. FIG. 1 is a plane view showing a configuration of an array substrate used in a photoelectric conversion device in accordance with the first exemplary embodiment of the present invention. FIG. 2 is a cross section taken along the line II-II of FIG. 1.

On the array substrate, photoreceptor pixel areas are arranged in array. In FIG. 1, only one photoreceptor pixel area is shown. As shown in FIGS. 1 and 2, one photo diode 100 and one thin-film transistor (hereinafter called "TFT") 101 are provided in each photoreceptor pixel area. Therefore, photo diodes 100 and TFTs 101 are arranged in array on the array substrate. The photo diode 100 is electrically connected to the TFT 101.

Note that the area in which the photo diodes 100 and TFTs 101 are formed in array is called "element area" and the area outside the element area is called "peripheral area". For example, the element area is formed in a rectangular shape and the peripheral area is formed in a frame shape. Further, the peripheral area is formed on the outer side of a terminal portion for wiring that is formed in the element area. Therefore, the element area is located at the center of the array substrate, and a terminal area in which the terminal for wiring is formed is located outside this element area. Further, the peripheral area is located outside the terminal area.

In the element area, a plurality of gate lines 2 and a plurality of data lines 15 are formed. The plurality of gate lines are arranged in parallel to each other. Similarly, the plurality of data lines 15 are arranged in parallel to each other. In FIG. 1, the gate lines 2 are formed so as to extend in the crosswise direction and the data lines 15 are formed so as to extend in the lengthwise direction. A part of the gate line 2 that constitutes the TFT 101 functions as a gate electrode. The data line 15 is connected to the source electrode 6 of the TFT 101. The gate lines 2 and the data lines 15 are formed so that they intersect each other with a gate insulating film 3, a first passivation film 8, and a second passivation film 14 interposed therebetween.

Each of the gate lines 2 supplies a gate signal to the TFTs 101 that are arranged in a row. In this way, the TFTs 101 that are arranged in a row are simultaneously turned on. Each of the data lines 15 is used to successively read data from a plurality of TFTs 100 that are arranged in a column. An area partitioned by neighboring gate lines 2 and neighboring data lines 15 becomes a photoreceptor pixel area. Therefore, the photoelectric conversion device is a two-dimensional array photodetector.

The gate lines 2 are formed on a transparent insulative substrate 1 composed of glass or the like. The gate lines 2 are formed with a film-thickness of 150 to 300 nm, for example, from metal containing low-resistance metallic material such as aluminum (Al) as the main ingredient. By using the low-resistance metallic material, the electrical resistance of the gate lines 2 can be reduced, thus making it possible to form a large photoelectric conversion device. As for the metal containing Al as the main ingredient, an Al alloy containing Ni such as AlNiNd, i.e., an Al—Ni alloy can be used. Needless to say, other Al alloys may be also used. Further, as for the material that can be used for the gate line 2, material containing copper (Cu), which is also low-resistance metallic material, can be also used instead of Al. Note that although a case where the end face of the gate line 2 is formed perpendicularly to the substrate 1 is shown as an example in FIG. 2, the end face of the gate line 2 is preferably formed in a tapered shape. In this way, the coating property of a layer formed in the upper layer can be improved, thus reducing the failures caused by broken lines and the like.

The gate insulating film 3 is formed so as to cover the gate lines 2. The film-thickness of the gate insulating film 3 is, for example, 200 to 400 nm. Note that although it is not illustrated in the figures, the part of the gate insulating film 3 located in the end portion of the substrate 1 is removed in the peripheral area provided outside the terminal area.

Further, a semiconductor layer 4 is provided on the gate insulating film 3 in the formation area of the TFT 101. That is, the semiconductor layer 4 is formed on the gate insulating film 3 so that the semiconductor layer 4 is placed over the gate line 2, and an area of the gate line 2 that overlaps this semiconductor layer 4 becomes a gate electrode. The semiconductor layer 4 is provided in an island-like shape in such a manner that the semiconductor layer 4 is opposed to the gate electrode with the gate insulating film 3 interposed therebetween. For example, the semiconductor layer 4 is formed with a film-thickness of 100 to 200 nm from amorphous silicon doped with hydrogen atoms (hereinafter referred to as "a-Si:H").

An ohmic contact layer 5 doped with a conductive impurity is formed at each end of the semiconductor layer 4. The areas of the semiconductor layer 4 corresponding to the ohmic contact layers 5 become source and drain regions. Specifically, the area of the semiconductor layer 4 corresponding to the ohmic contact layer 5 on the left side in FIG. 2 becomes the source region. Meanwhile, the area of the semiconductor layer 4 corresponding to the ohmic contact layer 5 on the right side in FIG. 2 becomes the drain region. In this manner, the source and drain regions are formed on both ends of the semiconductor layer 4. Further, the area of the semiconductor layer 4 located between the source and drain regions becomes a channel region. No ohmic contact layer 5 is formed over the channel region of the semiconductor layer 4. For example, the ohmic contact layer 5 is formed with a film-thickness of 20 to 50 nm from a-Si:H that is doped with an n-type impurity such as phosphorus (P) at a high concentration (hereinafter referred to as "n+a-Si:H"). Note that the end face of the part of the semiconductor layer 4 that constitutes the channel is preferably formed in a tapered shape. In this way, the coating property of a layer formed in the upper layer can be improved, thus reducing the failures caused by broken lines and the like.

A source electrode 6 and a drain electrode 7 are formed on the ohmic contact layer 5. Specifically, the source electrode 6 is formed on the ohmic contact layer 5 located on the source region side. Meanwhile, the drain electrode 7 is formed on the ohmic contact layer 5 located on the drain region side. The source electrode 6 and the drain electrode 7 are connected to the semiconductor layer 4 through the ohmic contact layer 5. In this manner, the inversely-staggered structure TFT 101 of a bottom gate type is formed. The TFT 101 is located near the intersection of the gate line 2 and the data line 15. Further, the source electrode 6 and the drain electrode 7 are formed so that they extend to the outside of the channel region of the semiconductor layer 4. That is, similarly to the ohmic contact layer 5, the source electrode 6 and the drain electrode 7 are not formed over the channel region of the semiconductor layer 4. For example, the source electrode 6 and the drain electrode 7 are formed with a film-thickness of 50 to 300 nm by a film of metal having a high melting point such as Cr. Note that the material that can be used for the source electrode 6 and the drain electrode 7 is not limited to the above-described film of metal having a high melting point such as Cr, and other metal that can provide ohmic contact with Si can be also used.

The first passivation film 8 is formed so as to cover these source electrode 6, drain electrode 7, and semiconductor layer 4. That is, the TFT 101 is covered with the first passivation film 8. In the first passivation film 8, a contact hole CHI that reaches the drain electrode 7 is formed. The first passivation film 8 is formed with a film-thickness of 200 to 400 nm from, for example, silicon oxide ($SiO_2$), which has a low dielectric constant. The material that can be used for the first passivation film 8 is not limited to silicon oxide, and SiN, SiO, or a laminated film of these substances can be also used. Note that although it is not shown in the figures, the part of the first passivation film 8 located in the end portion of the substrate 1 is removed in the peripheral area provided outside the terminal area.

Then, a photo diode 100 is provided on the first passivation film 8. The photo diode 100 is provided for each photoreceptor pixel area. The photo diode 100 includes a lower electrode 10, a photoelectric conversion layer 11, and an upper electrode 12.

The lower electrode 10 is formed on the first passivation film 8 in such a manner that the lower electrode 10 is connected to the drain electrode 7 through the contact hole CHI. The lower electrode 10 is formed so as to extend from a place on the drain electrode 7 into the photoreceptor pixel area. In this example, the lower electrode 10 having a roughly rectangular shape is disposed at the center of the photoreceptor pixel area. The lower electrode 10 is electrically connected to the photoelectric conversion layer 11, which is described later, and functions as the cathode electrode of the photo diode 100. The lower electrode 10 is formed with a film-thickness of 50 to 200 nm by, for example, a conductive thin-film composed of metal having a high melting point such as Cr.

The photoelectric conversion layer 11 is formed on this lower electrode 10. The photoelectric conversion layer 11 is disposed at the center of the photoreceptor pixel area in a roughly rectangular shape, and functions as a photoreceptor pixel. In this example, the photoelectric conversion layer 11, whose shape is smaller than that of the lower electrode 10, is disposed within the lower electrode 10 in such a manner that any part of the photoelectric conversion layer 11 does not stick out from the lower electrode 10. That is, the photoelectric conversion layer 11 is formed so as to be contained within the lower electrode 10. The photoelectric conversion layer 11 has a three-layer structure in which an n-type silicon (n-Si) film 111, an intrinsic silicon (i-Si) film 112, and a p-type silicon (p-Si) film 113 are successively stacked from the substrate 1 side.

The n-Si film 111 is composed of an amorphous silicon film doped with an n-type impurity such as phosphorus (P). The film-thickness of the n-Si film 111 is, for example, 5 to 100 nm. The i-Si film 112 is composed of an intrinsic amorphous silicon film. The film-thickness of the i-Si film 112 is, for example, 0.5 to 2.0 μm. The p-Si film 113 is composed of an amorphous silicon film doped with a p-type impurity such as boron (B). The film-thickness of the p-Si film 113 is, for example, 10 to 80 nm.

Then, the upper electrode 12 composed of a transparent conductive film is provided on the photoelectric conversion layer 11. The upper electrode 12 is electrically connected to the photoelectric conversion layer 11, and functions as the anode of the photo diode 100. This upper electrode 12 is formed in most of the area on the photoelectric conversion layer 11. In this first exemplary embodiment of the present invention, the upper electrode 12, which is slightly smaller than the upper surface of the photoelectric conversion layer 11, is provided. That is, the upper electrode 12 is formed with a smaller size than the upper surface of the photoelectric conversion layer 11 so that the upper electrode 12 is contained within the upper surface of the photoelectric conversion layer 11 as viewed from the top. The upper electrode 12 is formed with a film-thickness of 50 to 300 nm by, for example, a transparent conductive film containing indium oxide (ITO).

Further, in this first exemplary embodiment, a compound layer 20 composed of a compound of Si and metal is provided on the part of the photoelectric conversion layer 11 located outside the upper electrode 12. This compound layer 20 is formed on the part of the upper surface of the photoelectric conversion layer 11 that does not overlap the upper electrode 12. Specifically, the compound layer 20 is formed on the part of the surface layer of the p-Si film 113 that is not covered with the upper electrode 12. The compound layer 20 is provided on the peripheral portion of the upper surface of the photoelectric conversion layer 11 so that the compound layer 20 surrounds the upper electrode 12 as viewed from the top. The compound layer 20 is provided near the end portion of the upper surface of the photoelectric conversion layer 11.

As described above, the compound layer 20 is a protective film that is provided to protect the part of the upper surface of the photoelectric conversion layer 11 located outside the upper electrode 12. That is, the compound layer 20 protects the part of the upper surface of the photoelectric conversion layer 11 that sticks out from the upper electrode 12. The compound layer 20 is formed from, for example, a compound of Si and Cr. Note that the metal that forms a compound with Si is not limited to Cr, and other metal that can form a compound with Si can be also used.

The photo diode 100 constructed as described above converts received light into an electrical charge. Note that since the compound layer 20 is provided in the photo diode 100 in accordance with the first exemplary embodiment as described above, the electrical resistance of the part of the p-type silicon film 113 that is not covered with the upper electrode 12 can be lowered. Therefore, the response property of the charge transfer around the anode of the photo diode 100 can be improved.

A second passivation film 14 is formed so as to cover these upper electrode 12, compound layer 20, photoelectric conversion layer 11, and lower electrode 10. The second passivation film 14 is provided over roughly the entire surface of the substrate 1 so as to cover the photo diode 100 and the TFT 101. In this example, the second passivation film 14 is formed with a film-thickness of 0.5 to 1.5 μm by a silicon oxide film having a low dielectric constant in order to lower the additional capacitance associated with a bias line 16 and a data line 15, which are described later. Note that the second passivation film 14 is not limited to the single-layer structure of a non-coating-type transparent insulating film such as the above-described silicon oxide film. That is, a laminated-layer structure may be also used. When a laminated-layer structure is used, the second passivation film 14 may be, for example, a laminated film of $SiO_2/SiN/SiO_2$ or the like. Further, it may be a laminated film formed by stacking a coating-type transparent insulating film on a non-coating-type transparent insulating film. Further, the second passivation film 14 may have a single-layer structure of a coating-type transparent insulating film such as an SOG film.

On the upper electrode 12, a contact hole CH3 penetrating the second passivation film 14 is formed. Further, a contact hole CH2 penetrating the first passivation film 8 and the second passivation film 14 is formed on the source electrode 6. In this manner, the contact hole CH2 that extends from the surface of the second passivation film 14 to the source electrode 6 and the contact hole CH3 that extends from the surface of the second passivation film 14 to the upper electrode 12 are provided. As shown in FIG. 2, the side of the contact holes CH2 and CH3 is preferably formed in a tapered shape with respect to the substrate 1. In this way, the coating property of a layer formed in the upper layer can be improved, thus reducing the failures caused by broken lines and the like.

On the second passivation film 14, a data line 15 that connects to the source electrode 6 through the contact hole CH2 is provided. The data line 15 is a line that is used to read an electrical charge converted in the photo diode 100.

Further, a bias line 16 that connects to the upper electrode 12 through the contact hole CH3 is also provided on the second passivation film 14. The bias line 16 is formed by the same layer as the data line 15. The bias line 16 electrically connects to the photoelectric conversion layer 11 through the upper electrode 12. The bias line 16 supplies a reverse bias to the photo diode 100 so that the photo diode 100 becomes an Off-state when no light is incident on the photo diode 100. The bias line 16 is formed so as to pass over the photo diode 100. Further, similarly to the data line 15, the bias line 16 intersects the gate line 2 and electrically connects to the bias lines 16 of neighboring photoreceptor pixel areas outside the element area. Therefore, a plurality of bias lines 16 are formed within the element area. The plurality of bias lines 16 are provided in parallel to each other. Each bias line 16 is disposed between neighboring data lines 15. The bias lines and the data lines 15 are arranged in such a manner that they are roughly parallel to each other.

Further, an optical shield layer 17 that is used to optically shield the TFT 101 is formed on the second passivation film 14. The optical shield layer 17 is disposed in the layer above the TFT 101. The optical shield layer 17 is formed in the same layer as the data line 15 and bias line 16. In this example, the optical shield layer 17 is formed by, for example, a wider portion of the bias line 16. That is, the bias line 16 is formed in such a manner that the bias line 16 becomes wider at the intersection with the gate line 2 so as to cover the TFT 101.

These data line 15, bias line 16, and optical shield layer 17 are formed by a conductive film containing an Al alloy. Al alloys containing Ni (Al—Ni alloys) have a low electrical resistance and is superior in the heat-resistance property and in the contact characteristic with a conductive film. Therefore, they are preferable as material for a conductive film constituting the data line 15 and the bias line 16. In this example, it is formed from, for example, an AlNiNd film having a film-thickness of 0.5 to 1.5 μm. The data line 15, the bias line 16, and the optical shield layer 17 may be formed as a single-layer film of an Al—Ni alloy. Alternatively, they may be a laminated film in which an Al—Ni alloy film is formed as at least its uppermost layer or lowermost layer. For example, they may be a laminated film of AlNiNd and metal having a high melting point such as Mo, a Mo alloy or Cr. When an Al—Ni alloy film is formed as the uppermost layer, a nitride layer may be formed as its surface layer in order to suppress the reaction with a developing fluid. Note that the optical shield layer 17 does not necessarily have to be formed from the same material as the bias line 16, provided that it is disposed so that the TFT 101 can be shielded.

Then, a third passivation film 18 is formed so as to cover the data line 15, the bias line 16, and the optical shield layer 17. For example, the third passivation film 18 is formed from SiN. Further, a fourth passivation film 19 is formed on the third passivation film 18. The fourth passivation film 19 is a film whose surface is flat, and is composed of, for example, an organic resin.

In the photoelectric conversion device constructed as described above, the anode of the photo diode 100 is connected to the bias line 16 and the cathode is connected to the drain of the TFT 101. Further, the source of the TFT 101 is connected to the data line 15 and the gate is connected to the gate line 2. The photo diode 100 converts received light into an electrical charge. The data line 15 is used to read the converted electrical charge supplied from the photo diode 100 through the TFT 101. Specifically, the TFT 101 is turned on by a gate signal supplied to the gate line 2. In this way, an electrical charge from each photoreceptor pixel is read out to the data line 15 through the TFT 101.

Figure 3A:
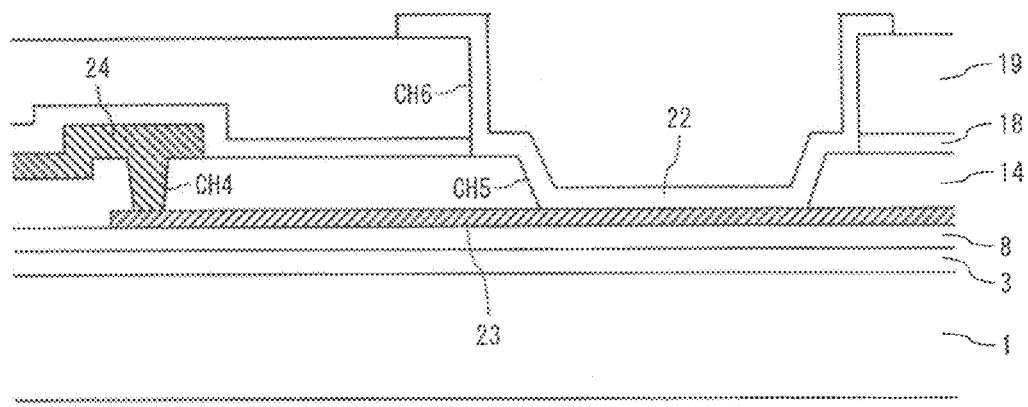
FIGS. 3A and 3B are cross sections showing a configuration example of a terminal portion of an array substrate in accordance with a first exemplary embodiment of the present invention.

Next, a configuration of a terminal area of the array substrate is explained with reference to FIGS. 3A and 3B. FIG. 3A is a cross section showing a configuration example of a terminal portion of an array substrate in accordance with the first exemplary embodiment of the present invention. As described above, a terminal area is provided outside the element area in which photo diodes 100 and TFTs 101 are arranged in array. Gate lines 2, data lines 15, and bias lines 16 are led out to the outside of the element area, and these lead lines extend to the terminal area. Further, gate terminals for the gate lines 2, data terminals for the data lines 15, and bias terminals for the bias lines 16 are disposed in the terminal area. These terminals are formed near the end portions of the respective lead lines. Each of the terminals is exposed on the surface side and connected to external wiring. Note that a short-ring line may be formed outside each of the terminals.

FIG. 3A is a cross section showing a configuration example of a terminal portion of an array substrate in accordance with the first exemplary embodiment. In FIG. 3A, a line conversion pattern 23 is formed on the first passivation film 8. This line conversion pattern 23 is formed in the same layer as the lower electrode 10. On the line conversion pattern 23, a contact hole CH4 penetrating the second passivation film 14 is formed. That is, the contact hole CH4 that extends from the surface of the second passivation film 14 to the line conversion pattern 23 is formed. Further, a lead line 24 is formed on the second passivation film 14. The lead line 24 is connected to the line conversion pattern 23 through the contact hole CH4. The line conversion pattern 23 is formed on the substrate-edge side with respect to the lead line 24.

Further, a contact hole CH5 penetrating the second passivation film 14 and a contact hole CH6 penetrating the third and fourth passivation films 18 and 19 are formed on the line conversion pattern 23. The contact hole CH6 is formed with a larger size than that of the contact hole CH5 so that the contact hole CH6 contains the contact hole CH5 therewithin as viewed from the top. A terminal lead electrode 22 that connects to the line conversion pattern 23 through these contact holes CH5 and CH6 is formed on the fourth passivation film 19. The terminal lead electrode 22 is provided so as to cover the contact holes CH5 and CH6. That is, the terminal lead electrode 22 is disposed in such a manner that it extends from the bottom of the contact hole CH5 to the surface of the fourth passivation film 19. The terminal lead electrode 22 is formed with a larger size than that of the contact hole CH6 so that the terminal lead electrode 22 contains the contact hole CH6 therewithin as viewed from the top.

The terminal lead electrode 22 is connected to the line conversion pattern 23 through the contact holes CH5 and CH6. That is, the terminal lead electrode 22 electrically connects to the lead line 24 through the line conversion pattern 23. The terminal lead electrode 22 is formed by, for example, a transparent conductive film. The terminal lead electrode 22 may be formed as a laminated film of a conductive film and a transparent conductive film in order to achieve excellent contact with the line conversion pattern 23 and the like. In this manner, the terminal lead electrode 22 functions as a terminal pad for the lead line 24. The terminal lead electrode 22 is formed in the terminal area, and serves as a lead terminal that is used to connect the respective line to external wiring. The lead line 24 can be used, for example, as a lead line for the data line 15 extending from the data line 15, or as a lead line for the bias line 16 extending from the bias line 16. The line conversion pattern 23 may be connected to a short-ring line outside the terminal area.

Figure 3B:
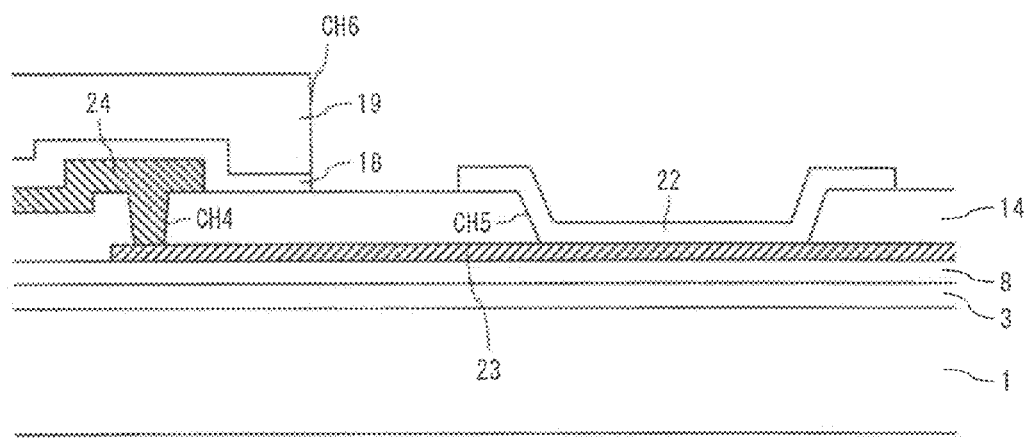

FIG. 3B is a cross section showing another configuration example of a terminal portion of an array substrate in accordance with the first exemplary embodiment. FIG. 3B is different from FIG. 3A in the area where the terminal lead electrode 22 is formed. Specifically, the terminal lead electrode 22 is formed inside the contact hole CH6 in such a manner that the terminal lead electrode 22 extends from the bottom of the contact hole CH5 to the surface of the second passivation film 14. In this way, the terminal lead electrode 22 may be provided so as to cover only the contact hole CH5 without covering the contact hole CH6. In this configuration, the terminal lead electrode 22 is formed with a smaller size than that of the contact hole CH6 so that the terminal lead electrode 22 is formed only inside the contact hole CH6 as viewed from the top. In other words, the contact hole CH6 having a larger size than the pattern of the terminal lead electrode 22 is formed.

Note that the configuration of the line conversion pattern 23 is not limited to the ones in which the line conversion pattern 23 is formed in the same layer as the lower electrode 10 as shown in FIGS. 3A and 3B. For example, other configurations in which the line conversion pattern 23 is formed in other layers such as the source electrode 6 and the drain electrode 7 may be also employed. Further, the line conversion pattern 23 is not limited to the single-layer film formed from one layer, and may be a laminated film of a plurality of conductive layers. For example, the line conversion pattern 23 may be formed by a laminated film in which a conductive film that is formed from the same layer as the lower electrode 10 is stacked on another conductive film that is formed from the same layer as the source electrode 6 and the drain electrode 7.

Further, although the lead line 24 is described as a lead line extending from the data line 15 or the bias line 16, it can be a lead line for the gate line 2 that connects to the gate line 2 through a contact hole provided in the gate insulating film 3. When the lead line 24 is a lead line led out from the gate line 2 as described above, a configuration in which the lead line 24 is formed by the same layer as the lower electrode 10 and the line conversion pattern 23 is formed by the same layer as the source electrode 6 and the drain electrode 7 may be employed. In this case, the gate line 2 is connected to the lead line 24 through a contact hole penetrating the gate insulating film 3 and the first passivation film 8, and the lead line 24 is connected to the line conversion pattern 23 through a contact hole provided in the first passivation film 8.

Note that although a configuration in which the lead line 24 led out from the respective line is converted in layer into the line conversion pattern 23 and then connected to the terminal lead electrode 22 is shown in FIGS. 3A and 3B, other configurations including, for example, one in which a lead line that is directly led out from a respective line to a place directly below the terminal lead electrode 22 without any layer conversion is directly connected to the terminal lead electrode 22 may be also employed.

Figure 4A:
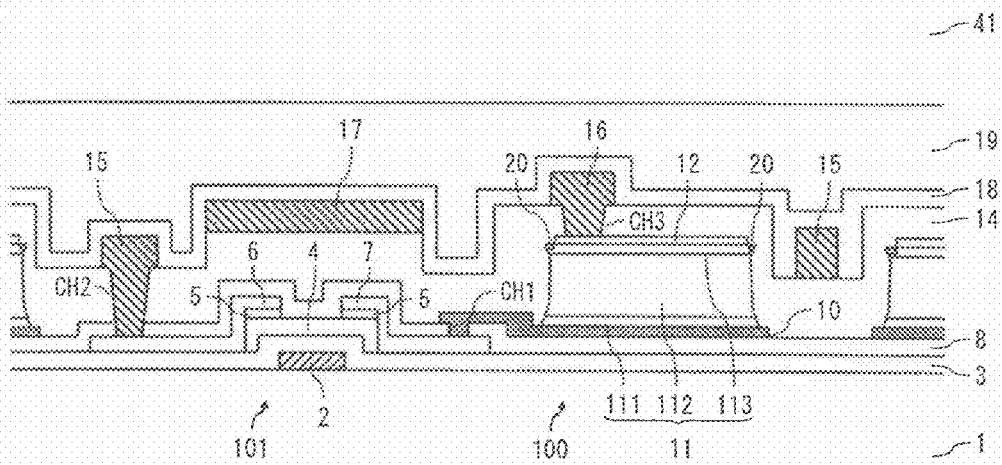
FIGS. 4A to 4C are imaginary figures for explaining a photoelectric conversion device and a radiographic device using an array substrate in accordance with a first exemplary embodiment of the present invention.
Figure 4B:
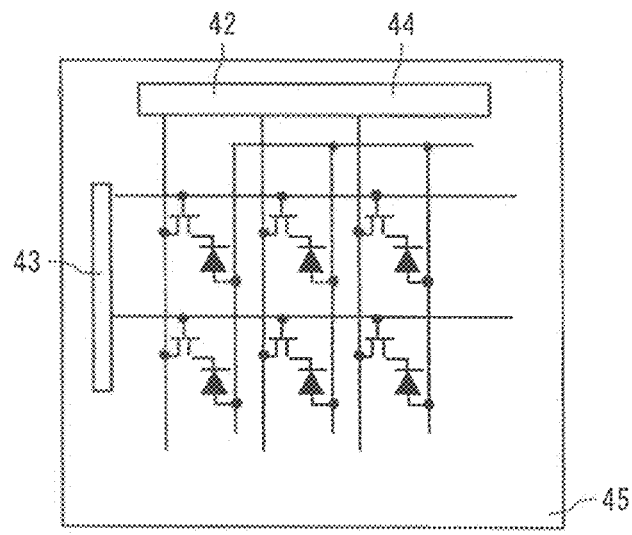
Figure 4C:
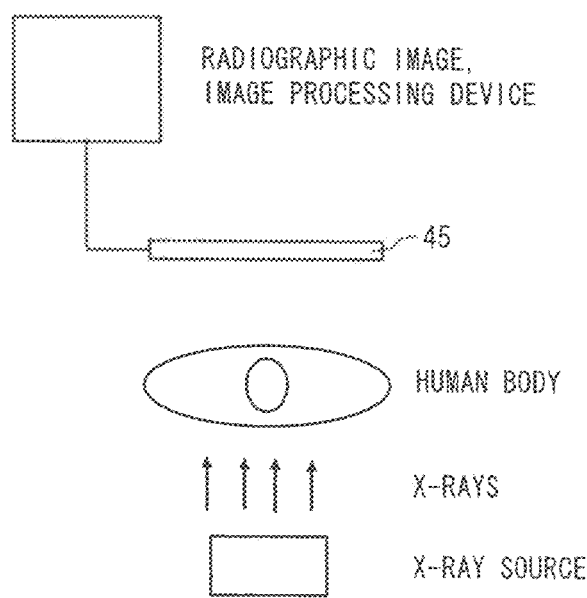

By using the array substrate having the configuration like this, a photoelectric conversion device such as a radiographic device can be manufactured by using a publicly-known method. FIGS. 4A to 4C are imaginary figures for explaining a photoelectric conversion device using an array substrate in accordance with the first exemplary embodiment of the present invention and a radiographic device. For example, as shown in FIG. 4A, a scintillator 41 that is composed of CsI or the like and used to convert X-rays into visible rays is deposited over the fourth passivation film 19. Then, as shown in FIG. 4B, a digital circuit 42 including a low-noise amplifier and an A/D converter, a driver circuit 43 that drives the TFTs 101, and a read circuit 44 that reads out an electrical charge are connected in order to produce a photoelectric conversion device 45. Then, by using the photoelectric conversion device 45 like this, a radiographic device like the one shown in FIG. 4C can be produced.

Next, a method of manufacturing an array substrate in accordance with the first exemplary embodiment of the present invention is explained with reference to FIGS. 5A to 5H. FIGS. 5A to 5H are cross sections showing a manufacturing process of an array substrate in accordance with the first exemplary embodiment. Note that these figures are cross sections each for a different manufacturing step taken in a portion corresponding to FIG. 2. Further, the following manufacturing process is shown merely as an example, and the present invention is not limited to the following embodiment.

Firstly, a first conductive thin-film is formed on a substrate 1 by a sputtering method or the like. As for the substrate 1, a transparent insulative substrate composed of glass or the like can be used. As for the first conductive thin-film, metal containing aluminum (Al) as the main ingredient can be used. For example, a film of an Al alloy containing Ni such as AlNiNd is formed as the first conductive thin-film. The film-thickness of the first conductive thin-film is 150 to 300 nm.

In order to suppress the reaction with a developing fluid, a nitrided AlNiNd layer may be formed on AlNiNd. Further, instead of AlNiNd, other Al—Ni alloys such as AlNiSi and AlNiMg may be used. Furthermore, instead of the Al-based film, Cu or a Cu alloy, which is also low-resistance metallic material, may be used. Even in such a case, the film can be also formed by a sputtering method or the like as in the case of the Al-based film. Further, the first conductive thin-film may be formed from the same material as that of the data line 15 and the bias line 16, and by doing so, the production efficiency is improved. The first exemplary embodiment of the present invention has such a configuration that this first conductive thin-film is not exposed when a photo diode 100 is formed. Therefore, it is possible to use metal containing Al and/or Cu as the main ingredient, which does not have strong resistance against damaging, as the first conductive thin-film. Accordingly, wiring lines having a low electrical resistance can be formed, thus making it possible to form a large photoelectric conversion device.

Next, a resist pattern used to form a gate line 2, a gate electrode, and the like is formed by a first photolithography process. Then, in an etching process, the first conductive thin-film is patterned by using, for example, a mixed acid of phosphoric acid/nitric acid/acetic acid to form the gate line 2, the gate electrode, and the like. By forming the gate electrode in a tapered shape in cross-section, it is possible to reduce the failures such as broken lines when a film is formed in a later process. Note that the etching fluid is not limited to the mixed acid of phosphoric acid, nitric acid, and acetic acid. Further, a dry etching may be also used instead of the wet etching.

Next, films of material for the gate insulating film 3, material for the semiconductor layer 4, and material for the ohmic contact layer 5 are formed in this order so that they cover the gate line 2, the gate electrode, and the like. They are formed on the entire surface of the substrate 1 by a plasma CVD method or the like. For example, a-Si:H and n+a-Si:H may be used as the material that becomes the semiconductor layer 4 and the material that becomes the ohmic contact layer 5 respectively. The gate insulating film 3 is formed with a film-thickness of 200 to 400 nm and the film that will become the semiconductor layer 4 is formed with a film-thickness of 100 to 200 nm. Further, the film that will become the ohmic contact layer 5 is formed with a film-thickness of 20 to 50 nm.

Note that photoelectric conversion devices are required to have high electrical-charge read efficiency, and thus requiring transistors having a high drive capability. Therefore, the formation process of the semiconductor layer 4 may be divided into two steps in order to achieve higher performance of the transistors. As the film-formation condition for such a case, the first layer is formed at a slow rate to obtain an excellent film and then the remaining layer is formed at a fast rate.

Next, a resist pattern used to obtain the pattern of the semiconductor layer 4 is formed by a second photolithography process. Then, in an etching process, the film that becomes the semiconductor layer 4 and the film that becomes the ohmic contact layer 5 are patterned into an island-like shape. In this way, a laminated-layer pattern having an island-like shape in which the film that becomes the ohmic contact layer 5 is stacked on the semiconductor layer 4 is formed. The etching is carried out by using plasma using, for example, a mixed gas of $SF_6$ and HCl. Note that, by forming the channel in a tapered shape in cross-section, it is possible to reduce the failures such as broken lines when a film is formed in a later process. Further, although the mixed gas of $SF_6$ and HCl is shown as an example of the etching gas, the present invention is not limited to this example.

Next, a resist pattern in which only the periphery of the substrate (not shown) is opened is formed by a third photolithography process. Then, a part of the gate insulating film 3 located above the peripheral area of the substrate 1 (not shown) is removed by an etching process. In the etching, patterning is carried out by using, for example, plasma of a mixed gas of $CF_4$ and $O_2$. The etching gas is not limited to this example.

Next, a second conductive thin-film used to form the source electrode 6 and the drain electrode 7 is formed. The formation of the second conductive thin-film is performed by forming a film of metal having a high melting point such as Cr by using a sputtering method or the like. The film-thickness is 50 to 300 nm. Note that the material that can be used for the second conductive thin-film is not limited to metal having a high melting point, and other metal that can provide ohmic contact with Si can be also used.

Figure 5A:
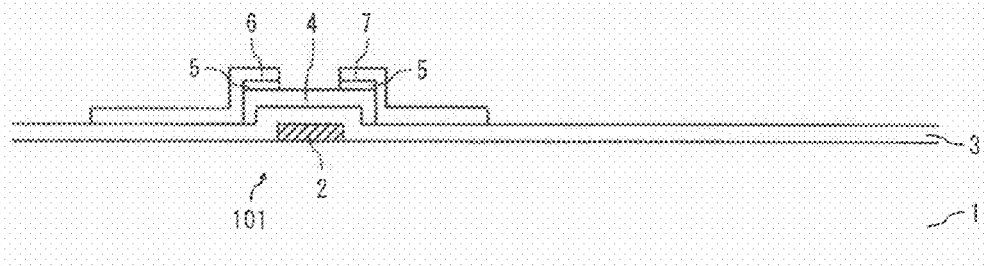
FIGS. 5A to 5H are cross sections showing a manufacturing process of an array substrate in accordance with a first exemplary embodiment of the present invention.

Next, a resist pattern used to form the source electrode 6 and the drain electrode 7 is formed by a fourth photolithography process. Then, in an etching process, the second conductive thin-film is patterned by using, for example, a mixed acid of cerium ammonium nitrate and nitric acid. In this way, the source electrode 6 and the drain electrode 7 are formed. After that, by using the formed electrodes as a mask, the film that becomes the ohmic contact layer 5 is etched by using, for example, plasma using a mixed gas of $SF_6$ and HCl. That is, of the film that has been patterned into an island-like shape and will become the ohmic contact layer 5, a part that is covered with neither the source electrode 6 nor the drain electrode 7 and thus is exposed is removed by the etching. As a result, the semiconductor layer 4 and the ohmic contact layer 5 in which a channel region is disposed between the source electrode 6 and the drain electrode 7 are formed as shown in FIG. 5A.

In the processes described so far, four photolithography processes are carried out. In the formation of the semiconductor layer 4 and the ohmic contact layer 5 into an island-like shape carried out in the second photolithography process as well as the formation of the source electrode 6 and the drain electrode 7, and channel etching of the ohmic contact layer 5 carried out in the fourth photolithography process, it is possible to reduce the number of necessary photolithography processes by using multiple tone-level exposure. The multiple tone-level exposure is an exposure technique using a gray-tone mask, a half-tone mask, or the like. By using the multiple tone-level exposure technique, patterns of the source electrode 6, the drain electrode 7, the semiconductor layer 4, and the ohmic contact layer 5 can be formed in a single photolithography process. In this way, the number of required masks can be reduced.

Note that although the mixed acid of cerium ammonium nitrate and nitric acid is shown as an example of the etching fluid to form the source electrode 6 and the drain electrode 7 and the mixed gas of $SF_6$ and HCl is shown as an example of the etching gas of the ohmic contact layer 5, the etching fluid and the etching gas are not limited to these examples. Further, in order to improve the TFT characteristics, plasma treatment using a hydrogen gas may be carried out to roughen the back-channel side, i.e., the surface of the semiconductor layer 4 before a first passivation film 8, which is described later, is formed. With the processes described above, the TFT 101 is formed.

Next, a first passivation film 8 is formed by a plasma CVD method or the like. As the first passivation film 8, a silicon oxide ($SiO_2$) film having a low dielectric constant is formed with a film-thickness of 200 to 400 nm.

Figure 5B:
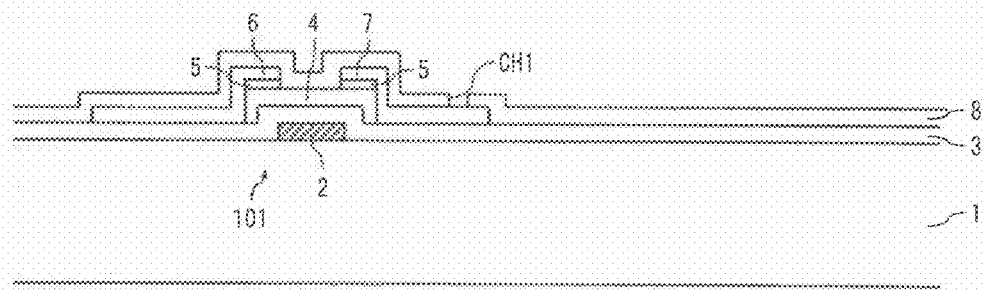

Then, a contact hole CHI that is used to bring the lower electrode 10 into contact with the drain electrode 7 is formed by a fifth photolithography process and an etching process. As for the etching, plasma of a mixed gas of $CF_4$ and $O_2$, for example, may be used. As a result, a structure shown in FIG. 5B is obtained.

Note that although the mixed gas of $CF_4$ and $O_2$ is shown as an example of the etching gas, the type of the etching gas is not limited to this example. Further, the silicon oxide film is shown as an example of the first passivation film 8, it is not limited to this example. SiN, SiO, or a laminated film of these substances may be used for the first passivation film 8, and in such a case, hydrogen, nitrogen, and $NH_3$ is added to the above-described gas in the formation of the first passivation film 8.

Next, a third conductive thin-film 10a, which will become the lower electrode 10 of the photo diode 100, is formed by a sputtering method or the like. As for the third conductive thin-film 10a, a film of metal having a high melting point such as Cr can be used. The film-thickness of the third conductive thin-film 10a is 50 to 200 nm.

Next, an n-type silicon film 111, an intrinsic silicon film 112, and p-type silicon film 113, which are used to form a photoelectric conversion layer 11, are formed by a plasma CVD method or the like. Specifically, while maintaining the vacuumed state, an n-type a-Si film, which is a P-doped amorphous silicon film, an i-type a-Si film, which is a non-doped amorphous silicon film, and a p-type a-Si film, which is a B-doped amorphous silicon film are successively formed as the n-type silicon film 111, the intrinsic silicon film 112, and the p-type silicon film 113 respectively. The film-thickness of the n-type silicon film 111 is preferably 5 to 100 nm and the film-thickness of the intrinsic silicon film 112 is preferably 0.5 to 2.0 μm. Further, the film-thickness of the p-type silicon film 113 is preferably 10 to 80 nm.

Figure 5C:
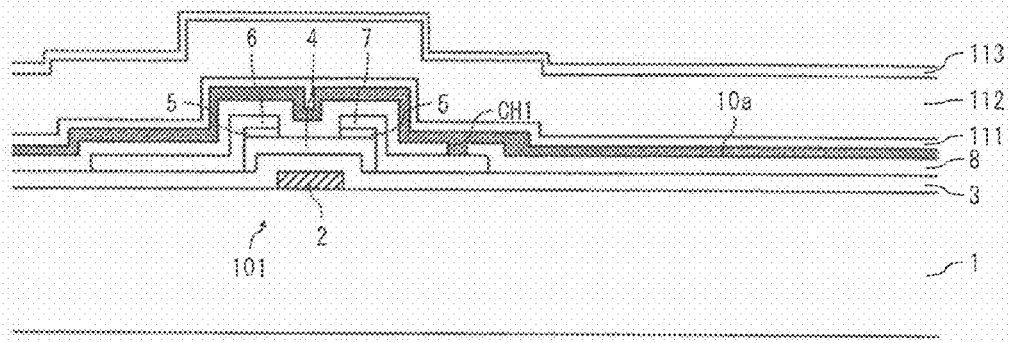

The formation of the n-type silicon film 111 is carried out by using a film-formation gas that is obtained by mixing 0.2 to 1.0% of $PH_3$ into a gas satisfying the film-formation condition for the intrinsic silicon film 112. Further, the formation of the p-type silicon film 113 is carried out by using a film-formation gas that is obtained by mixing 0.2 to 1.0% of $B_2H_6$ into a gas satisfying the film-formation condition for the intrinsic silicon film 112. In this way, a structure shown in FIG. 5C is obtained.

The p-type silicon film 113 may be formed by implanting B into the upper-layer portion of the intrinsic silicon film 112 in an ion shower doping method or an ion implantation method. Note that when the p-type silicon film 113 is formed by the ion implantation, an $SiO_2$ film having a film-thickness of 5 to 40 nm may be formed on the surface of the intrinsic silicon film 112 prior to the ion implantation. By doing so, the damage that is caused when B is implanted can be alleviated. In this case, the $SiO_2$ film may be removed by BHF or the like after the ion implantation.

Next, a fourth conducive thin-film used to form the upper electrode 12 is formed. As the fourth conducive thin-film, a transparent conductive film composed of ITO or the like is formed by a sputtering method or the like. The film-thickness of the fourth conducive thin-film is 50 to 300 nm. In this process, a transparent conductive film in an amorphous state is preferably formed under the condition that the substrate is not heated.

Figure 5D:
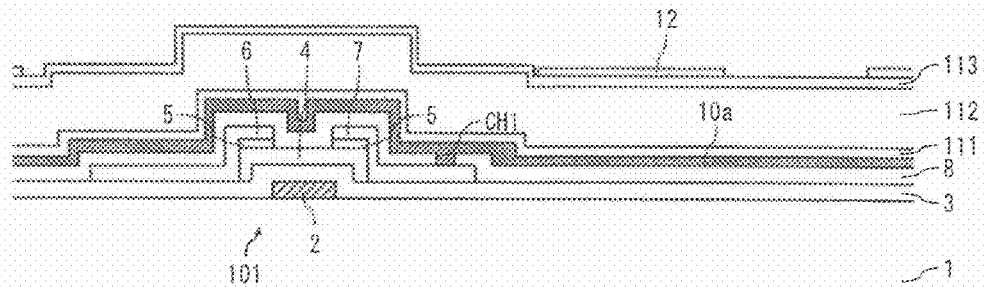

After the formation of the fourth conducive thin-film, a resist pattern used to obtain the upper electrode 12 is formed by a sixth photolithography process. Then, the fourth conducive thin-film is patterned by etching. As a result, the upper electrode 12 is formed. As shown in FIG. 5D, the upper electrode 12 is smaller than the photoelectric conversion layer 11, which is patterned in a subsequent process, by an amount equal to or larger than the processing margin.

Next, in this first exemplary embodiment, a compound layer 20 is formed in a part of the surface of the p-type silicon film 113 that is not covered with the upper electrode 12. In this example, a method in which heat treatment is carried out to form the compound layer 20 is explained. Specifically, firstly, a fifth conductive thin-film used to form the compound layer 20 is formed. The formation of the fifth conductive thin-film is performed, for example, by forming a film of metal having a high melting point such as Cr to a film-thickness of 50 to 200 nm by using a sputtering method or the like. After that, heat treatment is carried out. By this heat treatment, the upper electrode 12 is crystallized and the fifth conductive thin-film reacts with the p-type silicon film 113. That is, the heat treatment is carried out under such conditions that both the crystallization of the upper electrode 12 and the reaction between the fifth conductive thin-film with the p-type silicon film 113 can be achieved, for example, at 300° C. In this way, the upper electrode 12 is transformed from an amorphous transparent conductive film to a crystallized transparent conductive film and the compound layer 20 composed of a compound of Si and metal is formed on the part of the surface layer of the p-type silicon film 113 that is in direct contact with the fifth conductive thin-film.

Figure 5E:
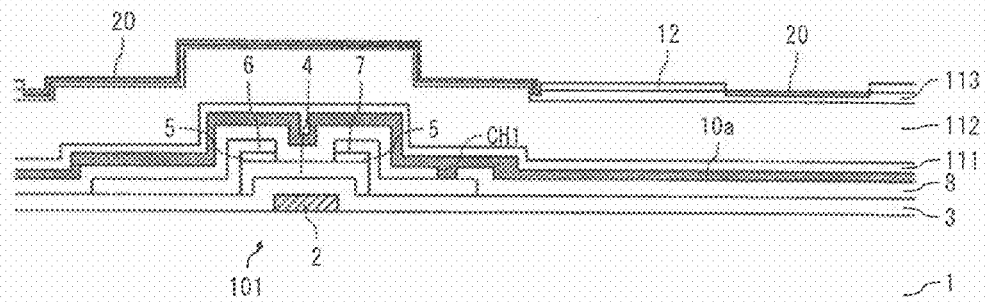

After the heat treatment, the fifth conductive thin-film is etched. For example, the fifth conductive thin-film is etched by using a mixed acid of cerium ammonium nitrate and nitric acid. As a result, the compound layer 20 is exposed on the surface as shown in FIG. 5E. Note that although the compound layer 20 is formed by forming a film of metal that forms a compound with Si as the fifth conductive thin-film and then carrying out the heat treatment in this example, a film of the compound layer 20 itself may be directly formed as the fifth conductive thin-film by a sputtering method or the like and then patterned by an additional photolithography process.

However, the former method in which the compound layer 20 is formed by carrying out a heat treatment allows the formation of the compound layer 20 and the crystallization of the transparent conductive film to be performed simultaneously. Therefore, when a transparent conductive film that is formed in an amorphous state and then crystallized is used as the upper electrode 12, the number of necessary processes can be reduced. Further, since the fifth conductive thin-film is etched after the upper electrode 12 is crystallized, the fifth conductive thin-film can be removed without causing any damage to the upper electrode 12. Therefore, the deterioration of the transmittance of the upper electrode 12 can be prevented. From these facts, the former method in which the compound layer 20 is formed by carrying out heat treatment is preferred when a transparent conductive film that is formed in an amorphous state and then crystallized is used as the upper electrode 12.

Next, a resist pattern is formed in the formation area of the photoelectric conversion layer 11 by a seventh photolithography process. In this process, a resist pattern that is slightly larger than the upper electrode 12 is formed in such a manner that the resist pattern contains the upper electrode 12 therewithin as viewed from the top. That is, a resist pattern that covers the pattern end portion of the upper electrode 12 and a part of the compound layer 20 located near the pattern end portion of the upper electrode 12 is formed. Then, the compound layer 20 and the three amorphous silicon layers, i.e., the n-type silicon film 111, the intrinsic silicon film 112, and the p-type silicon film 113 are patterned by etching by using, for example, plasma of a mixed gas of $SF_6$ and HCl. As a result, a photoelectric conversion layer 11 composed of three-layer laminated structure is formed and the compound layer 20 has such a shape that it surrounds the upper electrode 12 on the peripheral portion of the upper surface of the photoelectric conversion layer 11. Note that although the mixed gas of $SF_6$ and HCl is shows as an example of the etching gas, it is merely an example and other etching gases may be also suitably used.

After that, the resist pattern that is used as a mask in the etching process is removed by an ashing process and a film-removing process. Of these processes, at least the alteration layer of the resist pattern is removed in the ashing process. In this process, in the first exemplary embodiment, since the area of the amorphous silicon layer (photoelectric conversion layer 11) that is not covered with the upper electrode 12 is covered with the compound layer 20, the damage caused by the ashing can be reduced. That is, in contrast to the conventional configuration, since the amorphous silicon layer is not exposed in the area from which the resist pattern has receded during the ashing process, damage is less likely to occur in the end portion of the photoelectric conversion layer 11. Therefore, the leak current of the photo diode 100 can be suppressed. In this manner, the compound layer 20 becomes a protective film that protects the part of the upper surface of the photoelectric conversion layer 11 located outside the upper electrode 12, and thus functions as a damage suppression layer that prevents damage from occurring in the amorphous silicon layer.

Figure 5F:
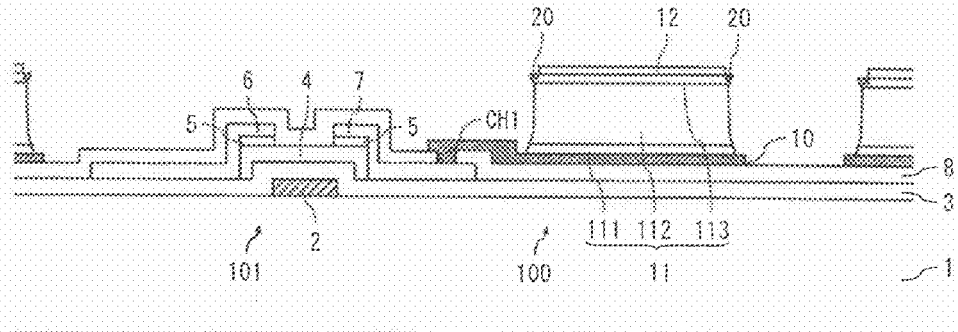

Next, a resist pattern that is slightly larger than the photoelectric conversion layer 11 is formed by an eighth photolithography process and the third conductive thin-film 10*a* is patterned. As a result, the lower electrode 10 is formed as shown in FIG. 5F. Note that in this process, the line conversion pattern 23 in the terminal area is also formed at the same time (see FIG. 3A). With the processes described above, the photo diode 100 is formed.

Next, a second passivation film 14 that is used to protect the photo diode 100 is formed. The second passivation film 14 is formed by forming a silicon oxide film having a low dielectric constant to a film-thickness of 0.5 to 1.5 μm by a CVD method, a sputtering method, or the like in order to reduce the additional capacitance associated with the data line 15 and the bias line 16. Note that the silicon oxide film is shown as an example of the second passivation film 14, it is not limited to this example. For example, a laminated film of $SiO_2$/SiN/$SiO_2$ or the like may be formed as the second passivation film 14. Further, a film obtained by stacking a coating-type transparent insulating film such as an SOG (Spin On Glass) film on the above-described insulating film formed by a CVD method, a sputtering method, or the like may be also used as the second passivation film 14. Furthermore, a single layer of a coating-type transparent insulating film such as an SOG film may be also used as the second passivation film 14.

Figure 5G:
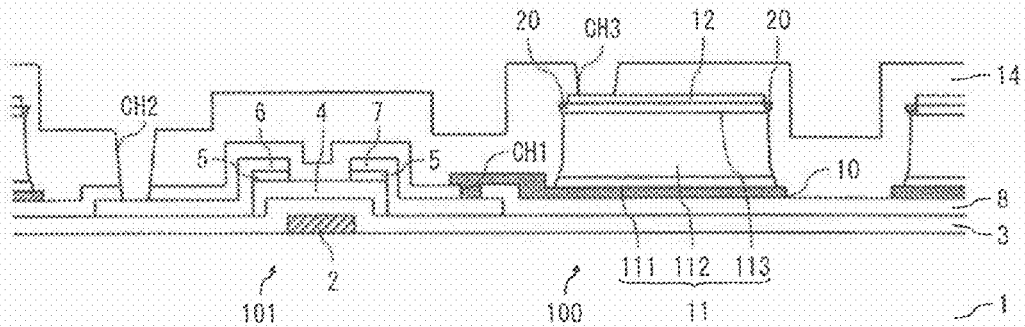

After that, a resist pattern corresponding to a contact hole CH2 that connects the source electrode 6 to the data line 15 and a contact hole CH3 that connects the upper electrode 12 to the bias line 16 is formed by a ninth photolithography process. Then, the contact holes CH2 and CH3 are opened by using plasma of a mixed gas of $CF_4$ and Ar. As a result, a structure shown in FIG. 5G is obtained.

Note that in this process, the contact holes CH4 and CH5 in the terminal area are also formed at the same time (see FIG. 3A). Further, when a contact hole is opened, it may be processed into a tapered shape in cross-section. By doing so, the covering property of the upper layer is improved and the failures such as broken lines are reduced.

Next, a sixth conductive thin-film is formed to form a data line 15, a bias line 16, an optical shield layer 17, and a lead line 24. As the sixth conductive thin-film, a film of an Al alloy containing Ni, which has a low electrical resistance and is superior in the heat-resistance property and in the contact characteristic with a transparent conductive film, is formed. For example, a film of AlNiNd is formed with a film-thickness of 0.5 to 1.5 μm as the sixth conductive thin-film. It may be a single layer of AlNiNd. Further, it may be a laminated film of AlNiNd and metals having a high melting point such as Mo, a Mo alloy or Cr. Further, in order to suppress the reaction with a developing fluid, a nitrided AlNiNd layer may be formed on AlNiNd. For example, by using a sputtering method or the like, a film of a Mo alloy is formed as an underlying layer and a film of AlNiNd is successively formed on the underlying layer. Note that although the Al alloy containing Ni is used in the above-described example, it is not limited to the Al alloy containing Ni, provided that it has a low electrical resistance wiring structure. That is, other metal that has an excellent contact characteristic with a transparent conductive film can be also used.

Figure 5H:
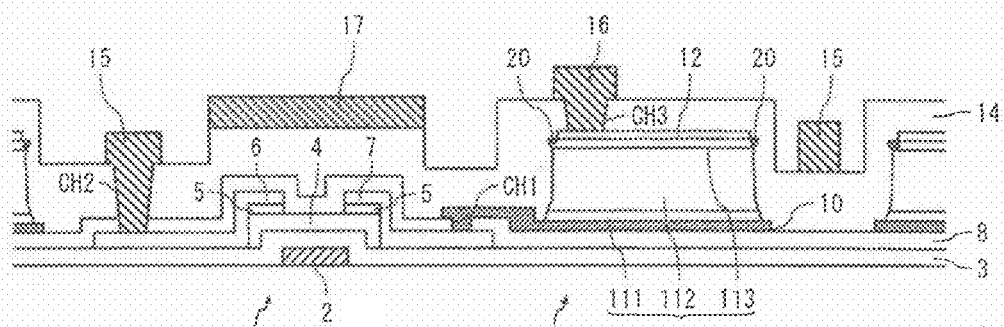

Next, a resist pattern corresponding to the data line 15, the bias line 16, the optical shield layer 17, and the lead line 24 is formed by a tenth photolithography process. In the case of the laminated film of AlNiNd and Mo, the patterning is carried out by using, for example, a mixed acid of phosphoric acid, nitric acid, and acetic acid. Note that although the mixed acid of phosphoric acid, nitric acid, and acetic acid is shown as an example of the etching fluid, the type of the etching fluid is not limited to this example. As a result, the data line 15, which is physically and electrically connected to the source electrode 6, as well as the bias line 16, which is physically and electrically connected to the upper electrode 12, are formed as shown in FIG. 5H. Further, in this process, the optical shield layer 17 on the TFT 101 and the lead line 24 in the terminal area are also formed at the same time.

Next, a third passivation film 18 and a fourth passivation film 19 are formed to protect the data line 15 and the bias line 16. For example, SiN is used for the third passivation film 18 and a flattening film is used for the fourth passivation film 19. As a result, the structure shown in FIG. 2 is obtained.

After that, a resist pattern used to form a contact hole CH6 that will provide connection with a terminal is formed in the terminal area by an eleventh photolithography process. Then, it is patterned by using plasma of a mixed gas of $CF_4$ and $O_2$. As a result, the contact hole CH6 penetrating the third and fourth passivation films 18 and 19 is opened (see FIG. 3A). Although the mixed gas of $CF_4$ and $O_2$ is shown as an example of the etching gas, it is not limited to this example. Note that a flattening film having photosensitivity may be used as the fourth passivation film 19. In this way, the patterning of the fourth passivation film 19 in the eleventh photolithography process can be carried out by exposure to light and a developing process.

Next, a conductive film that will become the terminal lead electrode 22 is formed. As for the material of the electrode, a transparent conductive film of amorphous ITO or the like is formed in order to ensure the reliability. Next, a resist pattern having a shape corresponding to the shape of the terminal is formed in a twelfth photolithography process. For example, the terminal lead electrode 22 is formed by etching using oxalic acid. For the terminal lead electrode 22, after that, the amorphous ITO is crystallized by annealing. As a result, the terminal lead electrode 22, which is connected to the line conversion pattern 23 through the contact hole CH5 or through the contact holes CH5 and CH6 as shown in FIGS. 3A and 3B, is formed. Note that the transparent conductive film is used for the terminal lead electrode 22 in the above explanation. However, a two-layer structure of a conductive film having an excellent property to achieve excellent contact with the line conversion pattern 23, and a transparent conductive film may be also used. Through the processes described above, an array substrate in accordance with the first exemplary embodiment of the present invention is completed.

As described above, in the first exemplary embodiment of the present invention, the compound layer 20 that covers a part of the amorphous silicon layer located outside the upper electrode 12 is formed, and then the amorphous silicon layer, which will become the photoelectric conversion layer 11, is patterned by etching. In this way, the compound layer 20 becomes a protective layer (damage suppression layer) during ashing that is performed to remove at least the alteration layer of the resist pattern used in the etching of the amorphous silicon layer, so that the damage to the photoelectric conversion layer 11 caused by the aching can be suppressed. Therefore, the damage that occurs in the end portion of the photoelectric conversion layer 11 can be reduced, thus suppressing the leak current of the photo diode 100. By lowering the noise level that is exhibited when no light is incident in this manner, it is possible to realize a photoelectric conversion device having a high S/N ratio.

Further, the compound layer 20 formed in this manner has such a shape that it protects the part of the upper surface of the photoelectric conversion layer 11 located outside the upper electrode 12. As a result, the electrical resistance of the part of the p-type silicon film 113 that is not covered with the upper electrode 12 can be lowered. Therefore, the response property of the charge transfer around the anode of the photo diode 100 can be improved, thus making it possible to realize a photoelectric conversion device that causes fewer afterimages. From these facts, in accordance with the first exemplary embodiment of the present invention, it is possible to provide a photoelectric conversion device having high performance and its manufacturing method.

Note that although a case where the gate insulating film 3 located on the periphery of the substrate is removed by using the pattern of the third photolithography process is explained as an example in the first exemplary embodiment, the present invention is not limited to this example. The gate insulating film 3 on the periphery may be removed after the source electrode 6 and the drain electrode 7 are formed. Alternatively, the ohmic contact layer 5, the semiconductor layer 4, and the gate insulating film 3 located on the periphery of the substrate may be simultaneously removed after the ohmic contact layer 5 is formed. Further, the first passivation film 8 and the gate insulating film 3 may be removed in the formation process of the contact hole CH1. In this case, it is preferably performed under such etching conditions that the dry-etching damage of the drain electrode 7 can be reduced. Further, although the contact holes CH4 and CH5 are formed simultaneously with the formation of the contact holes CH2 and CH3 in the first exemplary embodiment, they may be formed in different processes.

Figure 6:
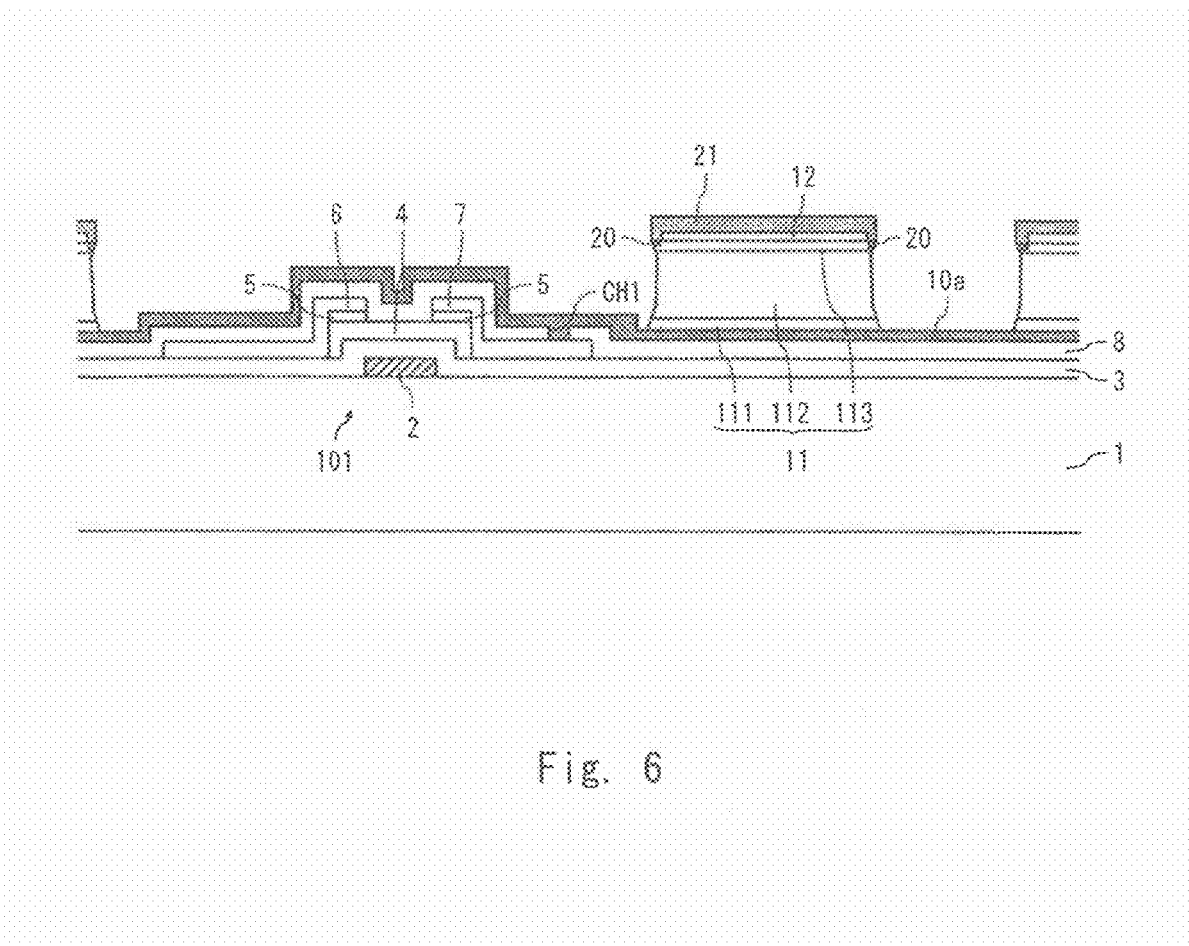
FIG. 6 is a cross section showing a manufacturing step of an array substrate in accordance with another embodiment of a first exemplary embodiment of the present invention.

Further, the etching to remove the fifth conductive thin-film is performed after the heat treatment and before the seventh photolithography process in the first exemplary embodiment. However, if the lower electrode 10 and the fifth conductive thin-film are composed of a combination of materials having etching selectivity, the timing at which the etching to remove the fifth conductive thin-film is performed does not necessarily have to be before the seventh photolithography process. Examples of such combinations of materials include a case where Cr is used for the lower electrode 10 and Mo is used for the fifth conductive thin-film. This is further explained with reference to FIG. 6. FIG. 6 is a cross section showing a manufacturing step of an array substrate in accordance with another embodiment of the first exemplary embodiment of the present invention. FIG. 6 shows one manufacturing step corresponding to a step that is performed after the manufacturing process of FIG. 5D and before that of FIG. 5F.

In this manufacturing method, after the upper electrode 12 is formed as shown in FIG. 5D, a fifth conductive thin-film used to form a compound layer 20 is formed and heat treatment is performed as in the case of the first exemplary embodiment. Then, after that, a seventh photolithography process is performed without performing the etching for removing the fifth conductive thin-film. That is, a resist pattern is formed on the fifth conductive thin-film, and each of the fifth conductive thin-film, the compound layer 20, and the amorphous silicon layer is patterned by etching. Note that since the compound layer 20 is covered with the fifth conductive thin-film, the compound layer 20 and the amorphous silicon layer are protected by the fifth conductive thin-film even if the resist pattern has receded during the etching process. Therefore, the damage to the compound layer 20 and/or the amorphous silicon layer can be avoided.

After the etching, the resist pattern is removed by an ashing process and a film-removing process. As a result, a structure shown in FIG. 6 is obtained. In this stage, the upper electrode 12 and the compound layer 20 located on the photoelectric conversion layer 11 are covered with the fifth conductive thin-film 21 as shown in FIG. 6. That is, in this example, the compound layer 20 and the fifth conductive thin-film 21 serve as a protective film that protects at least the part of the upper surface of the photoelectric conversion layer 11 located outside the upper electrode 12. Then, this protective film functions as a damage suppression layer that prevents damage from occurring in the amorphous silicon layer.

After that, the etching to remove the fifth conductive thin-film 21 is performed. However, this etching can be performed either before or after the etching of the third conductive thin-film 10a using a resist pattern formed in the eighth photolithography process. That is, the third conductive thin-film 10a may be patterned to form the lower electrode 10 after the fifth conductive thin-film 21 located above the photoelectric conversion layer 11 is removed. Alternatively, the third conductive thin-film 10a may be patterned to form the lower electrode 10 while leaving the fifth conductive thin-film 21 unremoved above the photoelectric conversion layer 11, and then the fifth conductive thin-film 21 may be removed after that. As a result, a structure shown in FIG. 5F is obtained.

Note that repair treatment to repair damage on the side of the photoelectric conversion layer 11 may be performed before the fifth conductive thin-film 21 is removed. In this process, hydrogen plasma treatment is performed by exposing the substrate 1 to a hydrogen plasma atmosphere. Since the damage repair treatment can be performed in a state where the upper electrode 12 is covered with the fifth conductive thin-film 21, the damage repair can be reliably performed on the side of the photoelectric conversion layer 11 without reducing the upper electrode 12. Therefore, the leak paths on the side of the photo diode 100 can be reduced, thus making it possible to reduce the leak current of the photo diode 100 even further. Note that when the hydrogen plasma treatment is performed as the damage repair treatment, Si-unbonded hands can be terminated with hydrogen inside the photoelectric conversion layer 11. Therefore, the leak paths inside the photoelectric conversion layer 11 can be also reduced.

Note that the film-thickness of 10 to 80 nm is adopted for the p-type silicon film 113 in the first exemplary embodiment because the leak current is small within that range. However, since the quantization efficiency can be improved by setting the film-thickness to 10 nm or less, the range of 10 nm or less may be adopted to give a high priority to the quantization efficiency. Further, when both of the improvement in the quantization efficiency and the reduction in the leak current need to be satisfied, other means to reduce the leak current may be combined as appropriate.

Second Exemplary Embodiment

Figure 7:
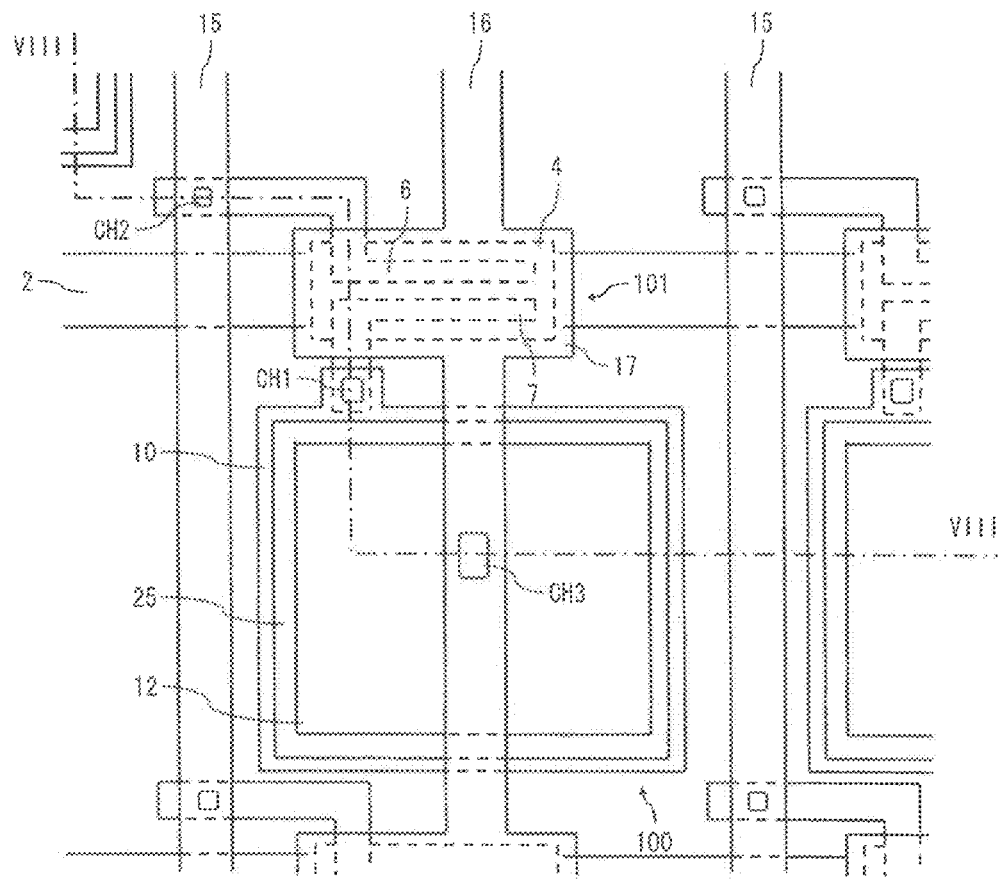
FIG. 7 is a plane view showing a configuration of an array substrate used in a photoelectric conversion device in accordance with a second exemplary embodiment of the present invention.
Figure 8:
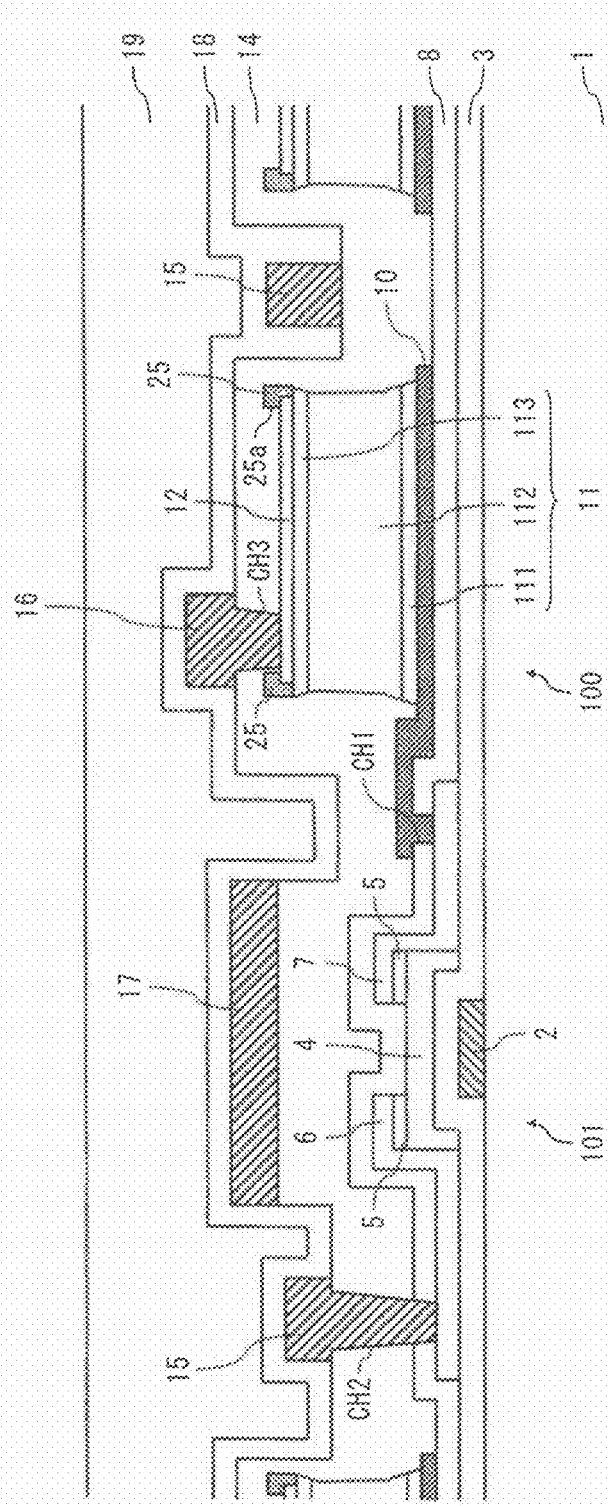
FIG. 8 is a cross section taken along the line VIII-VIII of FIG. 7.

A photo sensor (photoelectric conversion device) in accordance with a second exemplary embodiment of the present invention is explained with reference to FIGS. 7 and 8. FIG. 7 is a plane view showing a configuration of an array substrate used in a photoelectric conversion device in accordance with the second exemplary embodiment of the present invention. FIG. 8 is a cross section taken along the line VIII-VIII of FIG. 7. In the second exemplary embodiment of the present invention, a protective film, which is different from that of the first exemplary embodiment, is provided so as to cover a part of the upper surface of the photoelectric conversion layer 11 that sticks out from the upper electrode 12. The remaining configuration is similar to that of the first exemplary embodiment, and therefore it explanation is omitted.

In FIGS. 7 and 8, an optical shield film 25 composed of a conductive thin-film having an optically shielding property is provided on a part of the photoelectric conversion layer 11 located outside the upper electrode 12 in the second exemplary embodiment. The optical shield film 25 is formed from, for example, metal that does not diffuse into Si, such as Cr. The optical shield film 25 has an opening portion 25a on the upper electrode 12, and is formed in a frame shape.

Further, the optical shield film 25 covers at least the end portion of the photoelectric conversion layer 11. Although a case where the optical shield film 25 is formed in such a manner that the optical shield film 25 extends from a place on the part of the photoelectric conversion layer 11 located outside the upper electrode 12 to a place on the pattern of the upper electrode 12 and partially overlaps the upper electrode 12 is shown as an example in FIGS. 7 and 8, the optical shield film 25 does not necessarily have to overlap the upper electrode 12. However, it is preferable in terms of the electrical aspect that the optical shield film 25 overlaps the upper electrode 12. Note that the outer shape of the optical shield film 25 is identical to or similar to that of the upper surface of the photoelectric conversion layer 11. In this manner, the optical shield film 25 serves as a protective film that is provided so as to protect the part of the upper surface of the photoelectric conversion layer 11 located outside the upper electrode 12.

Since the optical shield film 25 is provided in the photo diode 100 in accordance with the second exemplary embodiment of the present invention as described above, light incident on the end portion of the photoelectric conversion layer 11, which is the area that tends to suffer permanent damage, can be shielded. As a result, even when light is incident on the end portion of the photoelectric conversion layer 11, which is the area that tends to suffer permanent damage, no electrical charge is generated by the light. Therefore, the decrease in the response speed of the charge transfer can be suppressed. Further, it is possible to realize a photoelectric conversion device that causes fewer afterimages. That is, in the damaged end portion of the photoelectric conversion layer 11, the converted electrical charge is trapped and hence the response speed of the charge transfer is lowered. However, in the second exemplary embodiment of the present invention, the incident light is shielded by the optical shield film 25 so that no electrical charge is generated in this portion. Therefore, the decrease in the response speed of the charge transfer is suppressed.

Figure 9A:
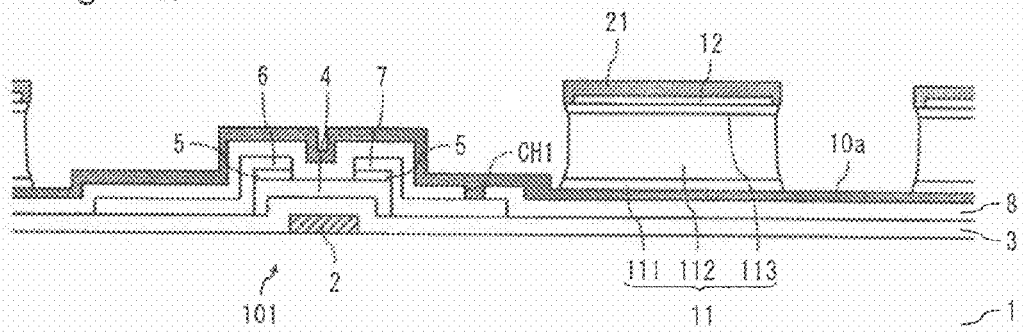
FIGS. 9A to 9C are cross sections showing manufacturing steps of an array substrate in accordance with a second exemplary embodiment of the present invention.
Figure 9B:
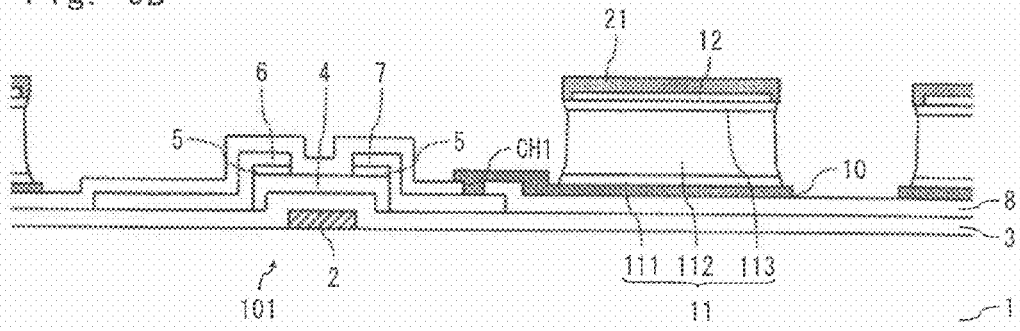
Figure 9C:
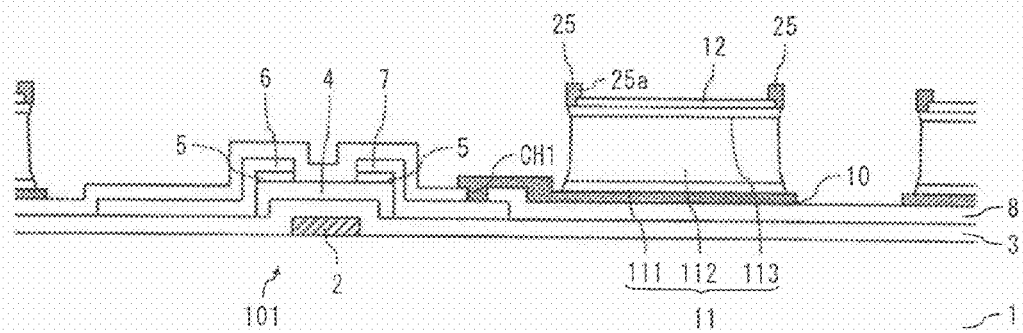

Next, a method of manufacturing an array substrate in accordance with the second exemplary embodiment of the present invention is explained with reference to FIGS. 9A to 9C. FIGS. 9A to 9C are cross sections showing manufacturing steps of an array substrate in accordance with the second exemplary embodiment. Note that these figures are cross sections each for a different manufacturing step taken in a portion corresponding to FIG. 8. Further, the following manufacturing process is shown merely as an example, and the present invention is not limited to the following embodiment. The second exemplary embodiment is different from the first exemplary embodiment only in the processes that carried out after the formation of the upper electrode 12 and before the formation of the second passivation film 14, and the other processes are similar to those of the first exemplary embodiment.

That is, similarly to the first exemplary embodiment, a TFT 101 is first formed (FIG. 5A) and then a first passivation film 8 is formed on the TFT 101 (FIG. 5B). Next, similarly to the first exemplary embodiment, a third conductive thin-film 10a, which becomes the lower electrode 10 of the photo diode 100, is formed on the first passivation film 8. Further, similarly to the first exemplary embodiment, an n-Si film 111, an i-Si film 112, and a p-Si film 113, which are used to form a photoelectric conversion layer 11, are formed on the third conductive thin-film 10a (FIG. 5C). Next, similarly to the first exemplary embodiment, an upper electrode 12 is formed on these films (FIG. 5D).

Next, a fifth conductive thin-film 21 used to form an optical shield film 25 is formed in the second exemplary embodiment. That is, a fifth conductive thin-film 21 having an optically shielding property is formed. The formation of the fifth conductive thin-film is performed, for example, by forming a film of metal having a high melting point such as Cr to a film-thickness of 50 to 200 nm by using a sputtering method or the like. After that, heat treatment at 230° C., for example, is carried out to crystallize the upper electrode 12. Note that in the second exemplary embodiment, the compound layer 20 of Si and metal, which is formed in the first exemplary embodiment, does not necessarily have to be formed in this heat treatment. Further, when the upper electrode 12 is already crystallized in advance, the heat treatment itself is unnecessary. Further, unlike the manufacturing method of an array substrate in accordance with the another embodiment of the first exemplary embodiment, the fifth conductive thin-film 21 does not necessarily have to have etching selectivity with respect to the lower electrode 10.

Next, a resist pattern is formed in the formation area of a photoelectric conversion layer 11 by a seventh photolithography process. In this process, similarly to the first exemplary embodiment, a resist pattern that is slightly larger than the upper electrode 12 is formed in such a manner that the resist pattern contains the upper electrode 12 therewithin. Then, the fifth conductive thin-film 21 is patterned by etching using, for example, a mixed acid of cerium ammonium nitrate and nitric acid. Then, the three amorphous silicon layers, i.e., the n-Si film 111, the i-Si film 112, and the p-Si film 113 are patterned by etching by using, for example, plasma of a mixed gas of $SF_6$ and HCl. As a result, a photoelectric conversion layer 11 composed of three-layer laminated structure is formed and the fifth conductive thin-film 21 is patterned into roughly the same shape as the upper surface of the photoelectric conversion layer 11. Note that although the mixed acid of cerium ammonium nitrate and nitric acid is shown as an example of the etching fluid and the mixed gas of $SF_6$ and HCl is shown as an example of the etching gas, they are merely an example and other etching fluids and etching gases may be also suitably used.

After that, the resist pattern that is used as a mask in the etching process is removed by an ashing process and a film-removing process. In this process, in the second exemplary embodiment, since at least the end portion of the photoelectric conversion layer 11 is covered with the fifth conductive thin-film 21, the damage caused to the end portion of the amorphous layer (photoelectric conversion layer 11) by the ashing can be reduced. That is, in contrast to the conventional configuration, since the amorphous silicon layer is not exposed in the area from which the resist pattern has receded during the ashing process, damage is less likely to occur in the end portion of the photoelectric conversion layer 11. Therefore, the leak current of the photo diode 100 can be suppressed. In this manner, the fifth conductive thin-film 21 becomes a protective film that protects the part of the upper surface of the photoelectric conversion layer 11 located on the outer side of the upper electrode 12, and thus functions as a damage suppression layer that prevents damage from occurring in the amorphous silicon layer. By removing the resist pattern, a structure shown in FIG. 9A is obtained.

Next, a resist pattern that is slightly larger than the photoelectric conversion layer 11 is formed by an eighth photolithography process and the third conductive thin-film 10a is patterned. As a result, the lower electrode 10 is formed as shown in FIG. 9B. Note that in this process, the line conversion pattern 23 in the terminal area is also formed at the same time (see FIG. 3A).

Next, a resist pattern used to form an opening portion 25a is formed by a ninth photolithography process. Then, the fifth conductive thin-film 21 is etched to open the opening portion 25a by using this resist pattern as a mask. As a result, a frame-shaped optical shield film 25 having the opening portion 25a is formed and the upper electrode 12 is exposed on the surface as shown in FIG. 9C. With the processes described above, the photo diode 100 is formed.

Note that damage repair treatment such as hydrogen plasma treatment may be performed in a state after the formation of the photoelectric conversion layer 11 and before the formation of the opening portion 25a (e.g., a state shown in FIG. 9A or 9B). That is, damage repair treatment by hydrogen plasma treatment may be performed on the patterned photoelectric conversion layer 11 after the resist pattern used to form the photoelectric conversion layer 11 is removed and before the upper electrode 12 is exposed. Since the damage repair treatment can be performed in a state where the upper electrode 12 is covered with the fifth conductive thin-film, the damage repair can be reliably performed on the side of the photoelectric conversion layer 11 without reducing the upper electrode 12. Further, after the optical shield film 25 is formed, the substrate 1 may be exposed to a nitrogen plasma atmosphere and/or an oxygen plasma atmosphere. That is, a cleaning process by plasma treatment using nitrogen, oxygen, or a mixed gas thereof is performed on the patterned photoelectric conversion layer 11. As a result, contamination and the like that is adhered on the side wall of the photoelectric conversion layer 11 during the formation of the opening portion 25a can be removed.

The subsequent processes, i.e., the process of the formation of the second passivation film 14 and subsequent processes are similar to those of the first exemplary embodiment, and therefore their explanation is omitted. However, in the second exemplary embodiment, the number of photolithography processes is greater than that of the first exemplary embodiment by one in order to form the opening portion 25a. Therefore, for the photolithography processes carried out after the formation of the opening portion 25a, the numbering sequence is advanced by one from the numbering sequence of the first exemplary embodiment. For example, the ninth photolithography process of the first exemplary embodiment becomes the tenth photolithography process in the second exemplary embodiment.

As described above, in the second exemplary embodiment of the present invention, the fifth conductive thin-film 21 that covers the amorphous silicon from the top of the upper electrode 12 is formed, and then the amorphous silicon layer, which will become the photoelectric conversion layer 11, is patterned by etching. In this way, the fifth conductive thin-film 21 serves as a protective layer (damage suppression layer) during the ashing that is performed to remove at least the alteration layer of the resist pattern used in the etching of the amorphous silicon layer, so that the damage to the photoelectric conversion layer 11 caused by the aching can be suppressed. Therefore, similarly to the first exemplary embodiment, the damage that occurs in the end portion of the photoelectric conversion layer 11 can be reduced, thus suppressing the leak current of the photo diode 100. By lowering the noise level that is exhibited when no light is incident in this manner, it is possible to realize a photoelectric conversion device having a high S/N ratio.

Further, of the fifth conductive thin-film 21 used as the damage suppression layer, at least the part located outside the upper electrode 12 is left as an optical shield film 25, so that light incident on the damaged portion of the photoelectric conversion layer 11 can be shielded. Therefore, the response property of the charge transfer in the end portion of the photo diode 100 can be improved, thus making it possible to realize a photoelectric conversion device that causes fewer afterimages. From these facts, in accordance with the second exemplary embodiment of the present invention, it is possible to provide a photoelectric conversion device having high performance and its manufacturing method as with the first exemplary embodiment.

Further, since the manufacturing process can be implemented even when the fifth conductive thin-film 21 and the lower electrode 10 do not have any etching selectivity in the second exemplary embodiment, the selectable range of the used material is widened. Therefore, it is possible to select the material with which the process control is easy. By using the same material for the lower electrode 10 and the fifth conductive thin-film 21, the target type can be unified and the device structure can be minimized. Therefore, the costs for maintaining the device and the like can be reduced.

Further, since damage repair treatment can be performed in a state where the upper electrode 12 is covered with the fifth conductive thin-film 21, the damage repair can be reliably performed on the side of the photoelectric conversion layer 11 without reducing the upper electrode 12. Therefore, the leak paths on the side of the photo diode 100 can be reduced, thus making it possible to reduce the leak current of the photo diode 100 even further. Further, since contamination and the like that is adhered on the side wall of the photoelectric conversion layer 11 when the opening portion 25a is formed in the fifth conductive thin-film 21 covering the upper electrode 12 can be removed by exposing the substrate 1 to a nitrogen plasma atmosphere and/or an oxygen plasma atmosphere, the leak current can be reduced even further.

Figure 10:
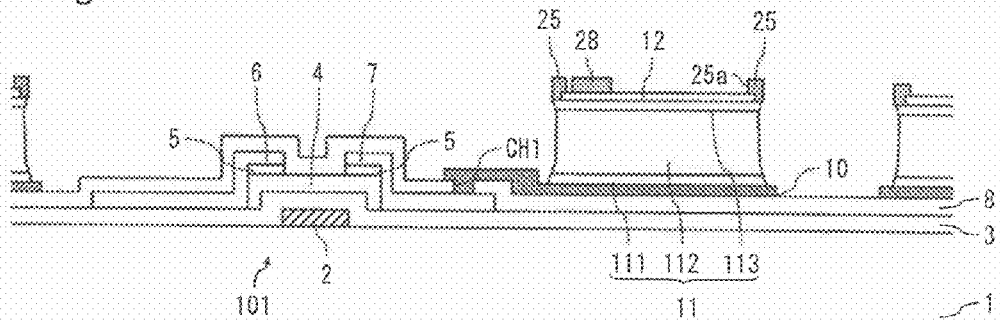
FIG. 10 is a cross section showing a manufacturing step of an array substrate in accordance with another embodiment of a second exemplary embodiment of the present invention.

Note that although an example where the fifth conductive thin-film 21 is entirely removed inside the opening portion 25a in the formation process of the opening portion 25a is explained in the above-described second exemplary embodiment, a pattern using the fifth conductive thin-film 21 may be formed inside the opening portion 25a. FIG. 10 is a cross section showing a manufacturing step of an array substrate in accordance with another embodiment of the second exemplary embodiment of the present invention. FIG. 10 shows one manufacturing step corresponding to FIG. 9C.

For example, a bias line connection pattern 28 may be formed inside the opening portion 25a in the formation process of the opening portion 25a as shown in FIG. 10. Note that the bias line connection pattern 28 is a pattern larger than the contact hole CH3 that is formed in the first passivation film 8 in a subsequent step by an amount equivalent to the processing margin, and is disposed in such a place that it contains the contact hole CH3 therewithin as viewed from the top.

In this case, in the photolithography process to form the resist pattern used to form the opening portion 25a, a resist pattern used to form the bias line connection pattern 28 is also formed. After that, the fifth conductive thin-film 21 is etched by using these resist patterns as a mask. As a result, the opening portion 25a as well as the bias line connection pattern 28 located inside this opening portion 25a are formed as shown in FIG. 10.

By forming the bias line connection pattern 28 in this manner, the upper electrode 12 can be protected by the bias line connection pattern 28 when the contact hole CH3 is formed. Therefore, even if the upper electrode 12 has a defect such as a pinhole, it is still possible to prevent damage from being caused in the p-Si film 113, which is the underlying layer of the upper electrode 12, by the etching that is carried out to form the contact hole CH3. Accordingly, the increase in the leak current of the photo diode 100 can be prevented.

Further, although the formation of the opening portion 25a is carried out after the formation of the lower electrode 10 in the above-described second exemplary embodiment, the timing of the formation of the opening portion 25a does not necessarily have to be after the formation of the lower electrode 10. This feature is explained with reference to FIGS. 11 and 12. The following explanation is made by using a configuration where the bias line connection pattern 28 is not provided as an example.

Figure 11:
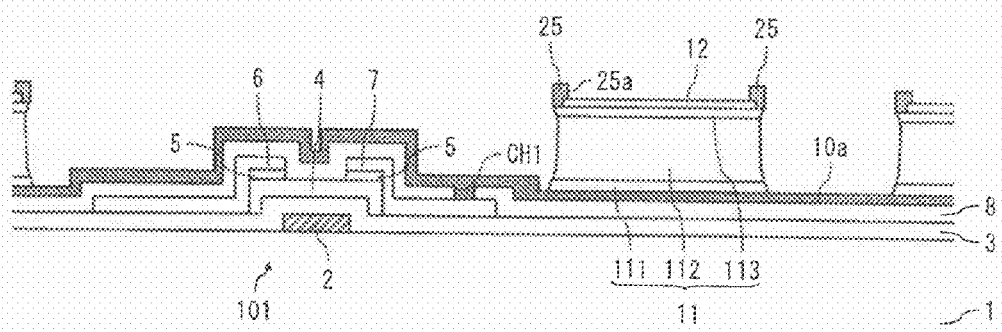
FIG. 11 is a cross section showing a manufacturing step of an array substrate in accordance with another embodiment of a second exemplary embodiment of the present invention.

FIG. 11 is a cross section showing a manufacturing step of an array substrate in accordance with another embodiment of the second exemplary embodiment. For example, the formation of the opening portion 25a may be carried out before the formation of the lower electrode 10. In this case, after the photoelectric conversion layer 11 is formed as shown in FIG. 9A, an opening portion 25a is opened in the fifth conductive thin-film 21 to form an optical shield film 25. As a result, a structure shown in FIG. 11 is obtained. After that, the third conductive thin-film 10a is patterned to form a lower electrode 10, and a structure shown in FIG. 9C is thereby obtained. As described above, the lower electrode 10 may be formed after the opening portion 25a is formed. That is, a resist pattern used to form the opening portion 25a is formed by the eighth photolithography process and the fifth conductive thin-film 21 is etched. Then after that, a resist pattern used to form the lower electrode 10 is formed by the ninth photolithography process and the third conductive thin-film 10a is etched.

Figure 12:
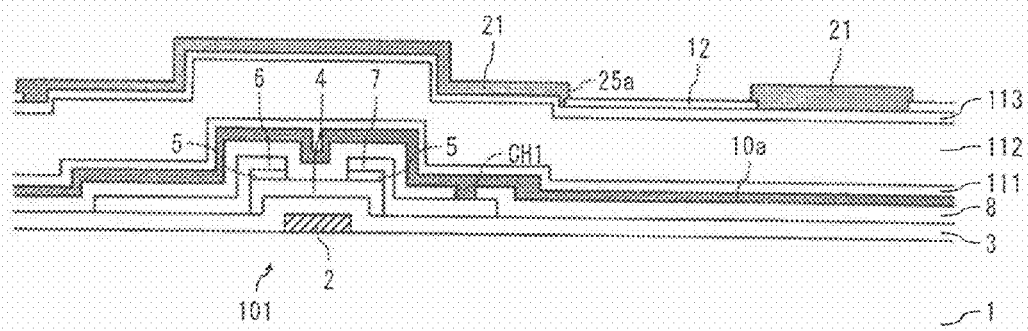
FIG. 12 is a cross section showing a manufacturing step of an array substrate in accordance with another embodiment of a second exemplary embodiment of the present invention.

FIG. 12 is a cross section showing a manufacturing step of an array substrate in accordance with another embodiment of the second exemplary embodiment. Further, the formation of the opening portion 25a can be also carried out before the formation of the photoelectric conversion layer 11. In this case, after the upper electrode 12 is formed as shown in FIG. 5D, a fifth conductive thin-film 21 that is used to form an optical shield film 25 is formed as in the case of the second exemplary embodiment. Then, a resist pattern used to form the opening portion 25a is formed by the seventh photolithography process and the fifth conductive thin-film 21 is etched. As a result, the opening portion 25a is formed on the upper electrode 12 as shown in FIG. 12. After that, a resist pattern is formed in the formation area of the photoelectric conversion layer 11 by the eighth photolithography process, and the fifth conductive thin-film 21, the n-Si film 111, the i-Si film 112, and the p-Si film 113 are etched to form the photoelectric conversion layer 11. Then, a resist pattern used to form the lower electrode 10 is formed by the ninth photolithography process and the third conductive thin-film 10a is etched.

Furthermore, the formation of the opening portion 25a may be carried out simultaneously with the formation of the lower electrode 10. In this case, both of the fifth conductive thin-film 21 and the third conductive thin-film 10a are etched by using the same resist pattern to form the opening portion 25a and the lower electrode 10.

Third Exemplary Embodiment

Figure 13:
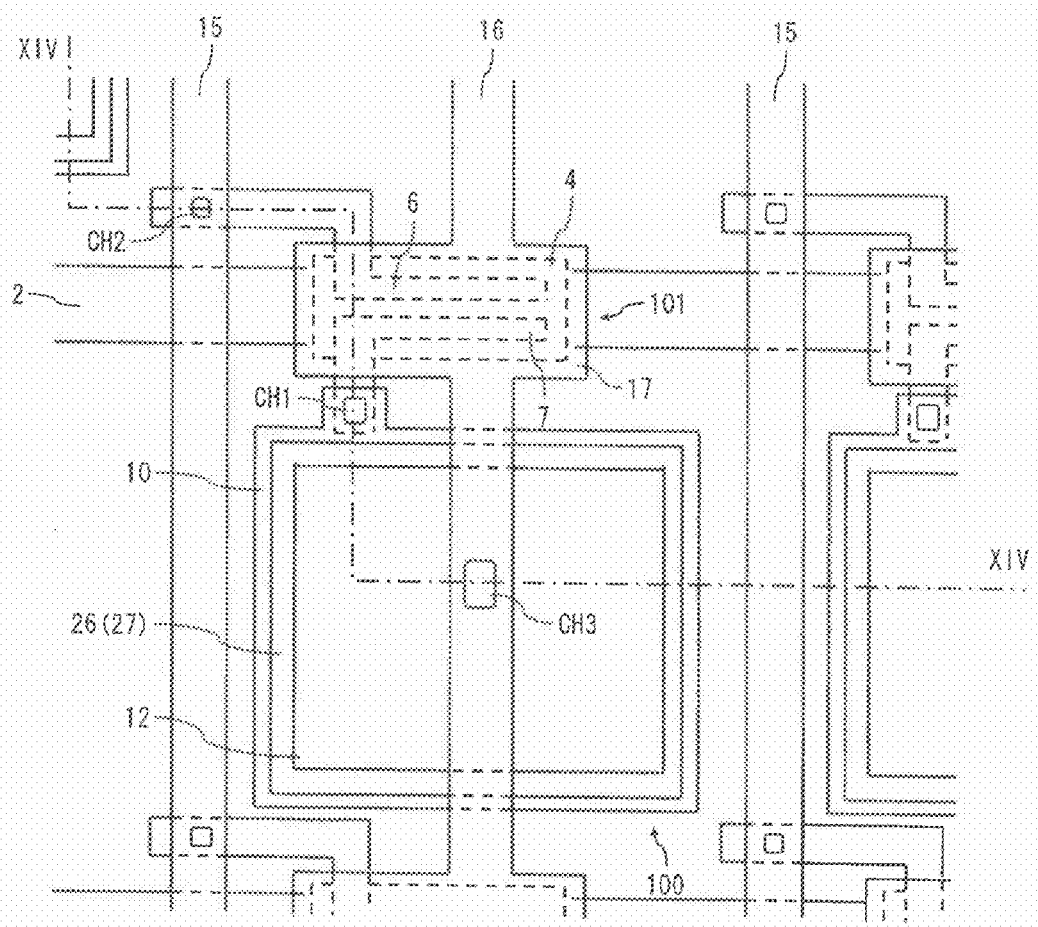
FIG. 13 is a plane view showing a configuration of an array substrate used in a photoelectric conversion device in accordance with a third exemplary embodiment of the present invention.
Figure 14:
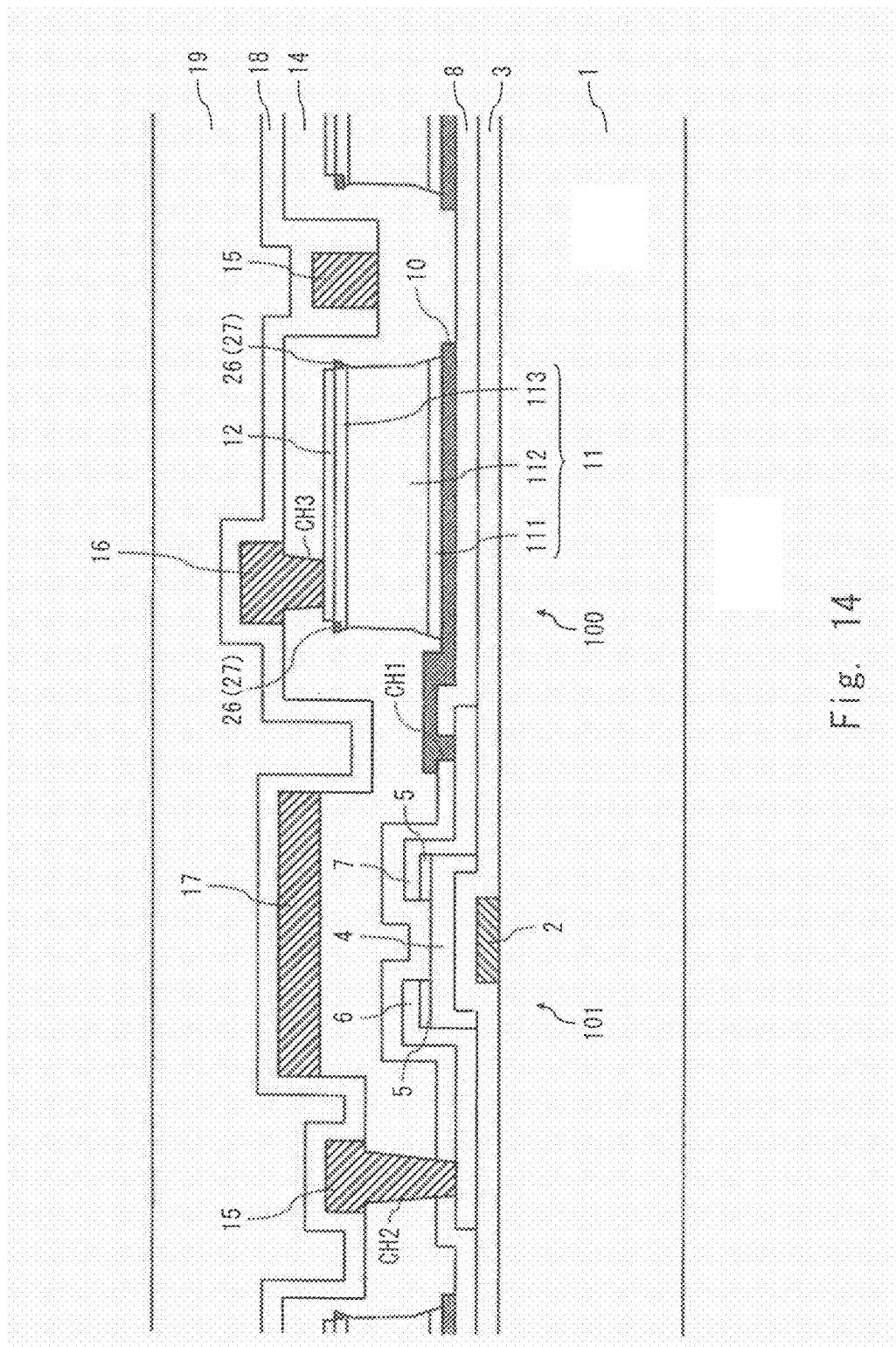
FIG. 14 is a cross section taken along the line XIV-XIV of FIG. 13.

A photo sensor (photoelectric conversion device) in accordance with a third exemplary embodiment of the present invention is explained with reference to FIGS. 13 and 14. FIG. 13 is a plane view showing a configuration of an array substrate used in a photoelectric conversion device in accordance with the third exemplary embodiment of the present invention. FIG. 14 is a cross section taken along the line XIV-XIV of FIG. 13. In the third exemplary embodiment of the present invention, a protective film, which is different from those of the first and second exemplary embodiments, is provided so as to cover a part of the upper surface of the photoelectric conversion layer 11 that sticks out from the upper electrode 12. The remaining configuration is similar to those of the first and second exemplary embodiments, and therefore it explanation is omitted.

In FIGS. 13 and 14, a nitrogen-containing insulating layer 26 such as an Si-nitride film is provided on a part of the photoelectric conversion layer 11 located outside the upper electrode 12 in the third exemplary embodiment. This nitrogen-containing insulating layer 26 is formed on a part of the upper surface of the photoelectric conversion layer 11 that does not overlap the upper electrode 12. Specifically, the nitrogen-containing insulating layer 26 is formed on a part of the surface layer of the p-Si film 113 that is not covered with the upper electrode 12. The nitrogen-containing insulating layer 26 is provided on the peripheral portion of the upper surface of the photoelectric conversion layer 11 so that the nitrogen-containing insulating layer 26 surrounds the upper electrode 12 as viewed from the top. The nitrogen-containing insulating layer 26 is provided near the end portion of the upper surface of the photoelectric conversion layer 11. In this manner, the nitrogen-containing insulating layer 26 is a protective film that is provided so as to protect the part of the upper surface of the photoelectric conversion layer 11 located outside the upper electrode 12.

Note that as indicated by the brackets in FIGS. 13 and 14, an oxygen-containing insulating layer 27 such as an Si-oxide film may be provided in place of the nitrogen-containing insulating layer 26. In this case, the oxygen-containing insulating layer 27 preferably contains a larger oxygen element content than that contained in the part of the p-Si film 113 surrounded by the oxygen-containing insulating layer 27 (that is, the area near the contact surface with the upper electrode 12).

The insulating layer such as the nitrogen-containing insulating layer 26 and the oxygen-containing insulating layer 27 is provided in the photo diode 100 in accordance with the third exemplary embodiment of the present invention as described above. Therefore, even when light is incident on the end portion of the photoelectric conversion layer 11, which is the area that tends to suffer permanent damage, no electrical charge is generated by the light in that portion. Accordingly, the decrease in the response speed of the charge transfer can be suppressed, thus making it possible to realize a photoelectric conversion device that causes fewer afterimages. That is, in the damaged end portion of the photoelectric conversion layer 11, the converted electrical charge is trapped and hence the response speed of the charge transfer is lowered. However, in the third exemplary embodiment of the present invention, an insulating layer is formed on the surface layer so that no electrical charge is generated in this portion. Therefore, the decrease in the response speed of the charge transfer is suppressed.

Figure 15:
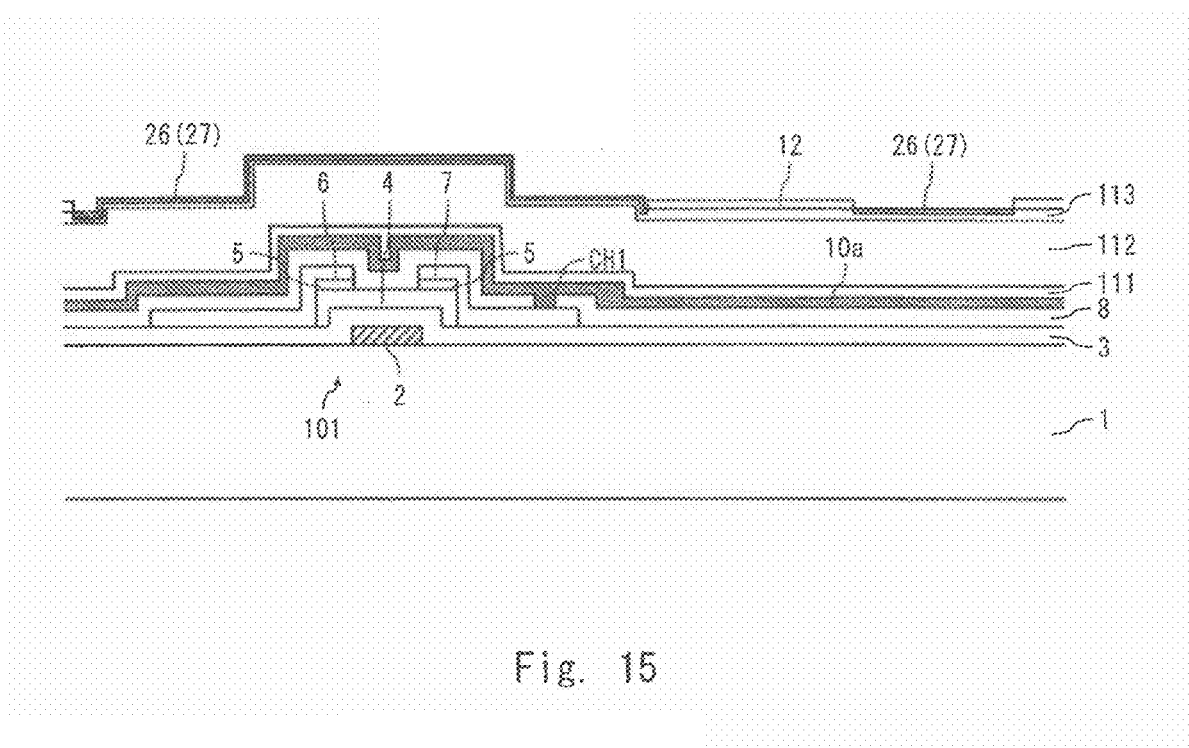
FIG. 15 is a cross section showing a manufacturing step of an array substrate in accordance with a third exemplary embodiment of the present invention.

Next, a method of manufacturing an array substrate in accordance with the third exemplary embodiment of the present invention is explained with reference to FIG. 15. FIG. 15 is a cross section showing a manufacturing step of an array substrate in accordance with the third exemplary embodiment. Note that FIG. 15 is a cross section for one manufacturing step taken in a portion corresponding to FIG. 14. Further, the following manufacturing process is shown merely as an example, and the present invention is not limited to the following embodiment. The third exemplary embodiment is different from the first and second exemplary embodiments only in the processes that carried out after the formation of the upper electrode 12 and before the formation of the second passivation film 14, and the other processes are similar to those of the first and second exemplary embodiments.

That is, similarly to the first exemplary embodiment, a TFT 101 is first formed (FIG. 5A) and then a first passivation film 8 is formed on the TFT 101 (FIG. 5B). Next, similarly to the first exemplary embodiment, a third conductive thin-film 10a, which becomes the lower electrode 10 of the photo diode 100, is formed on the first passivation film 8. Further, similarly to the first exemplary embodiment, an n-Si film 111, an i-Si film 112, and a p-Si film 113, which are used to form a photoelectric conversion layer 11, are formed on the third conductive thin-film 10a (FIG. 5C). Next, similarly to the first exemplary embodiment, an upper electrode 12 is formed on these films (FIG. 5D).

Next, in the third exemplary embodiment, a process for converting into an insulating film is carried out in order to form a nitrogen-containing insulating layer 26 on the surface of a part of the p-Si film 113 that is not covered with upper electrode 12. Specifically, for example, heat treatment is carried out in a nitrogen-rich atmosphere. With this heat treatment, the upper electrode 12 is crystallized and the area of the p-Si film 113 that is not covered with upper electrode 12 is converted into nitride. That is, the heat treatment is carried out under such conditions that both of the crystallization of the upper electrode 12 and the nitrization of the p-Si film 113 can be achieved, for example, at 300° C. As a result, the upper electrode 12 is transformed from the transparent amorphous conductive film to a transparent crystallized conductive film and an Si-nitride film having a thickness of several nm is formed as the nitrogen-containing insulating layer 26 on the surface layer of the exposed part of the p-Si film 113 that is not covered with upper electrode 12 as shown in FIG. 15.

Next, a resist pattern is formed in the formation area of a photoelectric conversion layer 11 by a seventh photolithography process. In this process, similarly to the first exemplary embodiment, a resist pattern that is slightly larger than the upper electrode 12 is formed in such a manner that the resist pattern contains the upper electrode 12 therewithin. That is, a resist pattern covering the end portion of the upper electrode 12 and the part of the nitrogen-containing insulating layer 26 located near the end portion of the upper electrode 12 is formed. Then, the nitrogen-containing insulating layer 26 and the three amorphous silicon layers, i.e., the n-Si film 111, the i-Si film 112, and the p-Si film 113 are patterned by etching by using, for example, plasma of a mixed gas of $SF_6$ and HCl. As a result, a photoelectric conversion layer 11 composed of three-layer laminated structure is formed and the nitrogen-containing insulating layer 26 is formed in such a shape that it surrounds the upper electrode 12 on the peripheral portion of the upper surface of the photoelectric conversion layer 11. Note that although the mixed gas of $SF_6$ and HCl is shown as an example of the etching gas, it is merely an example and other etching gases may be also suitably used.

After that, the resist pattern that is used as a mask in the etching process is removed by an ashing process and a film-removing process. In this process, in the third exemplary embodiment, since the area of the amorphous silicon layer (photoelectric conversion layer 11) that is not covered with the upper electrode 12 is covered with the nitrogen-containing insulating layer 26, the damage caused by the ashing can be reduced. That is, in contrast to the conventional configuration, since the amorphous silicon layer is not exposed in the area from which the resist pattern has receded during the ashing process, damage is less likely to occur in the end portion of the photoelectric conversion layer 11. Therefore, the leak current of the photo diode 100 can be suppressed. In this manner, the nitrogen-containing insulating layer 26 becomes a protective film that protects the part of the upper surface of the photoelectric conversion layer 11 located outside the upper electrode 12, and thus functions as a damage suppression layer that prevents damage from occurring in the amorphous silicon layer.

Next, a resist pattern that is slightly larger than the photoelectric conversion layer 11 is formed by an eighth photolithography process and the third conductive thin-film 10a is patterned. As a result, the lower electrode 10 is formed. Note that in this process, the line conversion pattern 23 in the terminal area is also formed at the same time (see FIG. 3A). With the processes described above, the photo diode 100 is formed.

The subsequent processes, i.e., the process of the formation of the second passivation film 14 and subsequent processes are similar to those of the first exemplary embodiment, and therefore their explanation is omitted.

Note that if an oxygen-containing insulating layer 27 is to be formed in place of the nitrogen-containing insulating layer 26, a process for converting into an insulating film is carried out in order to form the oxygen-containing insulating layer 27 on the part of the surface of the p-Si film 113 that is not covered with the upper electrode 12 after the formation of the upper electrode 12. For example, heat treatment is carried out in an oxygen-rich atmosphere. With this heat treatment, the upper electrode 12 is crystallized and the area of the p-Si film 113 that is not covered with upper electrode 12 is oxidized. That is, the heat treatment is carried out under such conditions that both of the crystallization of the upper electrode 12 and the oxidation of the p-Si film 113 can be achieved, for example, at 300° C. As a result, the upper electrode 12 is transformed from the transparent amorphous conductive film to a transparent crystallized conductive film and an Si-oxide film having a thickness of several nm is formed as the oxygen-containing insulating layer 27 on the surface layer of the exposed part of the p-Si film 113 that is not covered with upper electrode 12 as indicated by the brackets in FIG. 15.

Further, by carrying out the heat treatment in an oxygen-rich atmosphere as described above, the film quality of the upper electrode 12 can be also improved. By lowering the work function of the upper electrode 12 exploiting this film-quality improvement effect, the barrier with the p-Si film 113 can be lowered. As a result, electron holes can be easily pulled out, thus making it possible to realize a photoelectric conversion device having quantization efficiency. Note that the process for converting into an insulating film that is carried out to form an insulating layer such as the nitrogen-containing insulating layer 26 and the oxygen-containing insulating layer 27 is not limited to the heat treatment, and surface treatment such as plasma treatment may be also used.

As described above, in the third exemplary embodiment of the present invention, the process for converting the part of the surface of the amorphous silicon layer located outside the upper electrode 12 into an insulating film is carried out, and then the amorphous silicon layer, which will become the photoelectric conversion layer 11, is patterned by etching. In this way, the insulating layer formed on the surface of the amorphous silicon layer serves as a protective layer (damage suppression layer) during the ashing that is performed to remove at least the alteration layer of the resist pattern used in the etching of the amorphous silicon layer, so that the damage to the photoelectric conversion layer 11 caused by the aching can be suppressed. Therefore, similarly to the first exemplary embodiment, the damage that occurs in the end portion of the photoelectric conversion layer 11 can be reduced, thus suppressing the leak current of the photo diode 100. By lowering the noise level that is exhibited when no light is incident in this manner, it is possible to realize a photoelectric conversion device having a high S/N ratio.

Further, the insulating layer formed in this manner is formed in such a shape that it protects the part of the upper surface of the photoelectric conversion layer 11 located outside the upper electrode 12. As a result, it can eliminate the generation of an electrical charge in the damaged portion of the photoelectric conversion layer 11. Therefore, the response property of the charge transfer in the end portion of the photo diode 100 can be improved, thus making it possible to realize a photoelectric conversion device that causes fewer afterimages. From these facts, in accordance with the third exemplary embodiment of the present invention, it is possible to provide a photoelectric conversion device having high performance and its manufacturing method as with the first exemplary embodiment.

Further, in the third exemplary embodiment, since the above-described damage suppression layer can be easily formed with a smaller number of process steps than that of the first and second exemplary embodiments, the process costs can be reduced.

Note that the timing at which the process for converting into an insulating film that is carried out to form the insulating layer such as the nitrogen-containing insulating layer 26 and the oxygen-containing insulating layer 27 does not necessarily have to be before the seventh photolithography process as described above. That is, the process for converting into an insulating film may be carried out after the photoelectric conversion layer 11 is formed by pattering the three layers of the n-Si film 111, the i-Si film 112, and the p-Si film 113. However, the process for converting into an insulating film has to be carried out before the formation of the second passivation film 14.

For example, the process for converting into an insulating film can be carried out before the eighth photolithography process is carried out. For example, heat treatment is carried out at 300° C. in a nitrogen-rich or oxygen-rich atmosphere. With this heat treatment, the upper electrode 12 is crystallized and the area of the surface of the photoelectric conversion layer 11 that is not covered with the upper electrode 12 is converted into an insulating film with a depth of several nm. In this way, the side of the photoelectric conversion layer 11, in addition to the upper surface of the area of the photoelectric conversion layer 11 that is not covered with the upper electrode 12, can be also converted into an insulating film.

That is, the side of the photoelectric conversion layer 11 that is damaged in the etching process of the amorphous silicon layer can be also converted into an insulating film. As a result, the leak paths can be cut off. In addition, since the generation of an electrical charge is prevented, the reduction in the response speed due to the trapped electrical charge can be suppressed.

Figure 16A:
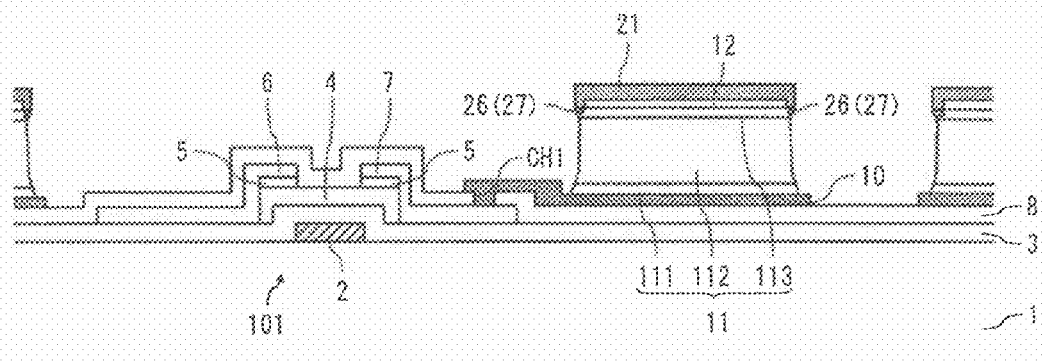
FIGS. 16A and 16B is a cross section showing manufacturing steps of an array substrate in accordance with another embodiment of a third exemplary embodiment of the present invention.
Figure 16B:
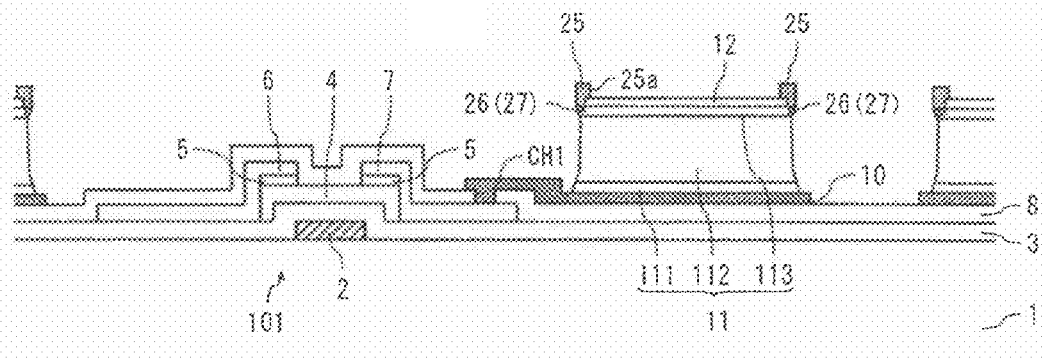

Note that the third exemplary embodiment can be combined with the second exemplary embodiment. That is, the protective film that is provided to protect the part of the upper surface of the photoelectric conversion layer 11 located outside the upper electrode 12 may be formed as a laminated film including an insulating layer such as the nitrogen-containing insulating layer 26 and the oxygen-containing insulating layer 27, and the optical shield film 25. When the protective film like this is to be formed, an additional process for forming the optical shield film 25 may be carried out after the formation of the insulating layer. This process is explained with reference to FIGS. 16A and 16B. FIGS. 16A and 16B are cross sections showing manufacturing steps of an array substrate in accordance with another embodiment of the third exemplary embodiment.

After the structure shown in FIG. 15 is obtained by carrying out the process for converting the part of the surface of the amorphous silicon layer located outside the upper electrode 12 into an insulating film, a fifth conductive thin-film 21 used to form an optical shield film 25 is formed. Then, a resist pattern is formed in the formation area of a photoelectric conversion layer 11 by a seventh photolithography process, and the fifth conductive thin-film 21 is etched. Next, the nitrogen-containing insulating layer 26 (or oxygen-containing insulating layer 27) and the amorphous silicon layer are etched. Then, the resist pattern that is used as a mask in the etching process is removed by an ashing process and a film-removing process.

After that, etching is carried out to open an opening portion 25a in the fifth conductive thin-film 21. Note that this etching may be carried out either before or after the etching of the third conductive thin-film 10a. A case where the etching of the third conductive thin-film 10a is carried out before the etching for the opening portion 25a is explained as an example. Firstly, a resist pattern is formed by an eighth photolithography process, and the third conductive thin-film 10a is patterned. As a result, the lower electrode 10 is formed as shown in FIG. 16A.

Next, a resist pattern used to form the opening portion 25a is formed by a ninth photolithography process and the fifth conductive thin-film 21 is etched. As a result, a frame-shaped optical shield film 25 having the opening portion 25a is formed and the upper electrode 12 is exposed on the surface as shown in FIG. 16B. The photo diode 100 may be formed in this manner.

Note that although the opening portion 25a is formed in the combination with the second exemplary embodiment in the above explanation, the fifth conductive thin-film 21 may be etched without carrying out the ninth photolithography process for forming the opening portion 25a. In this case, the fifth conductive thin-film 21 may not be completely removed and be left as an extremely-thin film on the surface of the nitrogen-containing insulating layer 26 (or oxygen-containing insulating layer 27). The term "extremely-thin film" means a film that is so thin that it is optically transparent. Further, similarly to the second exemplary embodiment, damage repair treatment such as hydrogen plasma treatment may be performed in a state where the upper electrode 12 is covered with the fifth conductive thin-film 21.

With the manufacturing method like this, the choices for the material used for the fifth conductive thin-film 21 can be widened. This is because, in contrast to the first and second exemplary embodiments in which metal that tends to diffuse into Si such as Al and Cu cannot be used as the fifth conductive thin-film 21, the generated nitrogen-containing insulating layer 26 (or oxygen-containing insulating layer 27) suppresses the diffusion of such metal. Therefore, the stability of the formation/removal process of the fifth conductive thin-film 21 can be improved.

Further, since the nitrogen-containing insulating layer 26 (or oxygen-containing insulating layer 27) is covered with the fifth conductive thin-film 21 when the amorphous silicon layer is etched, the pattern end portion of the amorphous silicon layer is not damaged even when the etching is carried out under the condition that the selection ratio with the nitrogen-containing insulating layer 26 (or oxygen-containing insulating layer 27) is small. Therefore, the process selection range for the etching of the amorphous silicon layer can be widened.

Further, by leaving the fifth conductive thin-film 21 partially or as an extremely-thin film on the nitrogen-containing insulating layer 26 (or oxygen-containing insulating layer 27), it is possible to apply an electric field on that area. Therefore, the transfer time of an electrical charge beneath the nitrogen-containing insulating layer 26 (or oxygen-containing insulating layer 27) can be shortened. Further, since a cleaning process can be performed in a state where the upper electrode 12 is covered with the fifth conductive thin-film 21, the damage repair can be reliably performed on the side of the photoelectric conversion layer 11 without reducing the upper electrode 12. Therefore, the leak paths on the side of the photo diode 100 can be reduced, thus making it possible to reduce the leak current of the photo diode 100 even further.

Note that the present invention is not limited to the above-described exemplary embodiments, and various modifications can be made without departing from the spirit and the scope of the present invention. For example, although a photoelectric conversion device in which an inversely-staggered structure TFT 101 of a bottom gate type is formed is explained in the first to third exemplary embodiments, the present invention can be also applied to photoelectric conversion devices in which TFTs 101 having other configurations such as a top gate type are formed. Further, although an example where the TFT 101 uses amorphous silicon is explained, the TFT 101 may be formed by using polysilicon or the like or other material such as IGZO.

Further, although a case where the lower electrode 10 of the photo diode 100 is connected to the drain electrode 7 of the TFT 101 through the contact hole CH1 provided in the first passivation film 8 is explained as an example in the first to third exemplary embodiments, the configuration of the connection portion between the photo diode 100 and the TFT 101 is not limited to this example.

For example, the drain electrode 7 may be extended to a place below the formation area of the photo diode 100 so that this extended portion of the drain electrode 7 functions as the lower electrode of the photo diode 100. Specifically, the photoelectric conversion layer 11 may be disposed in such a manner that it is in direct contact with the extended portion of the drain electrode 7 inside the contact hole CH1 that is provided in the part of the first passivation film 8 located on the extended portion of the drain electrode 7.

Further, the lower electrode 10 may be further formed between the extended portion of the drain electrode 7 having the above-described configuration and the photoelectric conversion layer 11. Specifically, the lower electrode 10 may be formed by the third conductive thin-film 10a so that it covers the contact hole CH1 provided on the extended portion of the drain electrode 7, and the photo diode 100 may be disposed by forming the photoelectric conversion layer 11 on this lower electrode 10.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A photoelectric conversion device comprising:
a thin-film transistor formed on a substrate; and
a photo diode electrically connected to the thin-film transistor,
wherein the photo diode comprises:
a lower electrode connected to a drain electrode of the thin-film transistor;
a photoelectric conversion layer formed on the lower electrode;
an upper electrode formed from a transparent conductive film on an upper surface of the photoelectric conversion layer, the upper electrode being formed so as to be contained within the upper surface of the photoelectric conversion layer as viewed from a top;
a protective film formed so as to protect a part of an upper surface of the photoelectric conversion layer located outside the upper electrode; and
a passivation layer which is separate from and thicker than the protective film, the passivation layer being provided over and contacting at least part of an upper surface of the upper electrode and at least part of an upper surface of the protective film, the passivation layer having an opening through which a conductive line makes contact with the upper surface of the upper electrode.

2. The photoelectric conversion device according to claim 1, wherein the protective film is a compound layer of Si and metal formed on a part of a surface layer of the photoelectric conversion layer located outside the upper electrode.

3. The photoelectric conversion device according to claim 1, wherein the protective film is an optical shield film formed on a part of the photoelectric conversion layer located outside the upper electrode.

4. The photoelectric conversion device according to claim 3, wherein the optical shield film extends from a place on a part of the photoelectric conversion layer located outside the upper electrode to a place on a pattern of the upper electrode.

5. The photoelectric conversion device according to claim 1, wherein the protective film is an insulating layer formed on a part of a surface layer of the photoelectric conversion layer located outside the upper electrode.

6. The photoelectric conversion device according to claim 5, wherein the insulating layer is a nitrogen-containing insulating film or an oxygen-containing insulating film.

7. The photoelectric conversion device according to claim 1, further comprising:
   a digital circuit comprising a low-noise amplifier and an A/D converter;
   a driver circuit that drives the thin-film transistor; and
   a read circuit that reads out an electrical charge converted in the photodiode.

8. The photoelectric conversion device according to claim 7, further comprising:
   a further passivation layer provided in a layer above the photodiode; and
   a scintillator formed above the passivation layer,
   wherein the photoelectric conversion device has a function of displaying an X-ray image by converting X-rays into visible rays by the scintillator.

9. A photoelectric conversion device comprising:
   a thin-film transistor formed on a substrate; and
   a photo diode electrically connected to the thin-film transistor,
   wherein the photo diode comprises:
   a lower electrode connected to a drain electrode of the thin-film transistor;
   a photoelectric conversion layer formed on the lower electrode;
   an upper electrode formed from a transparent conductive film on an upper surface of the photoelectric conversion layer, the upper electrode being formed so as to be contained within the upper surface of the photoelectric conversion layer as viewed from a top;
   a protective film formed so as to protect a part of an upper surface of the photoelectric conversion layer located outside the upper electrode; and
   a passivation layer which is separate from and thicker than the protective film, the passivation layer being provided over and contacting at least part of an upper surface of the upper electrode and at least part of an upper surface of the protective film, the passivation layer having an opening through which a conductive line makes contact with the upper surface of the upper electrode,
   wherein the protective film is disposed in such a place that the protective film protects a part of an upper surface of the photoelectric conversion layer located outside the upper electrode, and is not formed outside the photoelectric conversion layer as viewed from the top.

10. A photoelectric conversion device comprising:
    a thin-film transistor formed on a substrate; and
    a photo diode electrically connected to the thin-film transistor,
    wherein the photo diode comprises:
    a lower electrode connected to a drain electrode of the thin-film transistor;
    a photoelectric conversion layer formed on the lower electrode;
    an upper electrode formed from a transparent conductive film on an upper surface of the photoelectric conversion layer, the upper electrode being formed so as to be contained within the upper surface of the photoelectric conversion layer as viewed from a top;
    a protective film formed so as to protect a part of an upper surface of the photoelectric conversion layer located outside the upper electrode; and
    a passivation layer which is separate from and thicker than the protective film, the passivation layer being provided over and contacting at least part of an upper surface of the upper electrode and at least part of an upper surface of the protective film, the passivation layer having an opening through which a conductive line makes contact with the upper surface of the upper electrode,
    wherein the protective film is disposed only in such a place that the protective film protects a part of an upper surface of the photoelectric conversion layer located outside the upper electrode.

* * * * *